(12) United States Patent
Umeki et al.

(10) Patent No.: US 8,729,775 B2
(45) Date of Patent: May 20, 2014

(54) PIEZOELECTRIC VIBRATING DEVICES AND METHODS FOR MANUFACTURING SAME

(75) Inventors: Mitoshi Umeki, Saitama (JP); Ryoichi Ichikawa, Saitama (JP); Yoshiaki Amano, Saitama (JP); Kenji Kamezawa, Saitama (JP); Kenichi Kikuchi, Saitama (JP); Noritsugu Matsukura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 396 days.

(21) Appl. No.: 13/164,494

(22) Filed: Jun. 20, 2011

(65) Prior Publication Data

US 2011/0316390 A1    Dec. 29, 2011

(30) Foreign Application Priority Data

Jun. 23, 2010    (JP) .................. 2010-142197

(51) Int. Cl.
*H01L 41/053* (2006.01)
(52) U.S. Cl.
USPC ............................ 310/344; 310/341; 310/345
(58) Field of Classification Search
CPC ..................... H03H 9/1021; H03H 9/1014
USPC .......................................... 310/344, 341, 345
See application file for complete search history.

(56) References Cited

U.S. PATENT DOCUMENTS

| | | |
|---|---|---|
| 2005/0193548 A1 | 9/2005 | Nakazawa |
| 2007/0046151 A1 * | 3/2007 | Aratake ................ 310/344 |
| 2010/0033061 A1 * | 2/2010 | Ichikawa et al. .......... 310/344 |
| 2010/0237740 A1 * | 9/2010 | Aratake et al. ............ 310/312 |
| 2011/0050047 A1 * | 3/2011 | Numata ................... 310/344 |

FOREIGN PATENT DOCUMENTS

| | | |
|---|---|---|
| JP | S54-084990 | 7/1979 |
| JP | 60-053054 | 3/1985 |
| JP | H03-082924 U1 | 8/1991 |
| JP | H04-023326 | 1/1992 |
| JP | H04-337668 | 11/1992 |
| JP | H05-009026 U | 2/1993 |
| JP | H08-148961 | 6/1996 |
| JP | 09-055638 | 2/1997 |
| JP | H11-261368 | 9/1999 |

(Continued)

OTHER PUBLICATIONS

JPO Translation of 2002-026679, Minoru.*

(Continued)

*Primary Examiner* — Derek Rosenau
*Assistant Examiner* — Bryan Gordon
(74) *Attorney, Agent, or Firm* — Klarquist Sparkman, LLP

(57) ABSTRACT

An exemplary piezoelectric vibrating device includes a piezoelectric vibrating piece that vibrates when electrically energized. A first package plate has a main recess in which the piezoelectric vibrating piece is placed, and a peripheral surface surrounding the recess. A second package plate is bonded to the peripheral surface of the first package plate in airtight manner. A band of adhesive bonds the first package plate to the second package plate. The adhesive band surrounds the peripheral surface. Between the adhesive and the main recess is a band of metal film. The band of metal film prevents gas, generated from the adhesive, from flowing into the recess. The band of metal film surrounds the peripheral surface and is disposed inboard of the band of adhesive.

12 Claims, 26 Drawing Sheets

(56) References Cited

FOREIGN PATENT DOCUMENTS

| | | |
|---|---|---|
| JP | 2000-244274 | 9/2000 |
| JP | 2002-026679 | 1/2002 |
| JP | 2002-050939 | 2/2002 |
| JP | 2002-118437 | 4/2002 |
| JP | 2002-124845 | 4/2002 |
| JP | 2003-133884 | 5/2003 |
| JP | 2006-332685 | 12/2006 |
| JP | 2007-181130 | 7/2007 |
| JP | 2010-093675 | 4/2010 |
| WO | WO 2006/104265 A1 | 10/2006 |
| WO | WO 2008/152837 A1 | 12/2008 |
| WO | WO 2010/001885 | 1/2010 |
| WO | WO 2010/061468 | 6/2010 |

OTHER PUBLICATIONS

Office Action for related Japanese Patent Application No. 2010-142197, 6 pages, Jun. 13, 2012 (in Japanese).

* cited by examiner

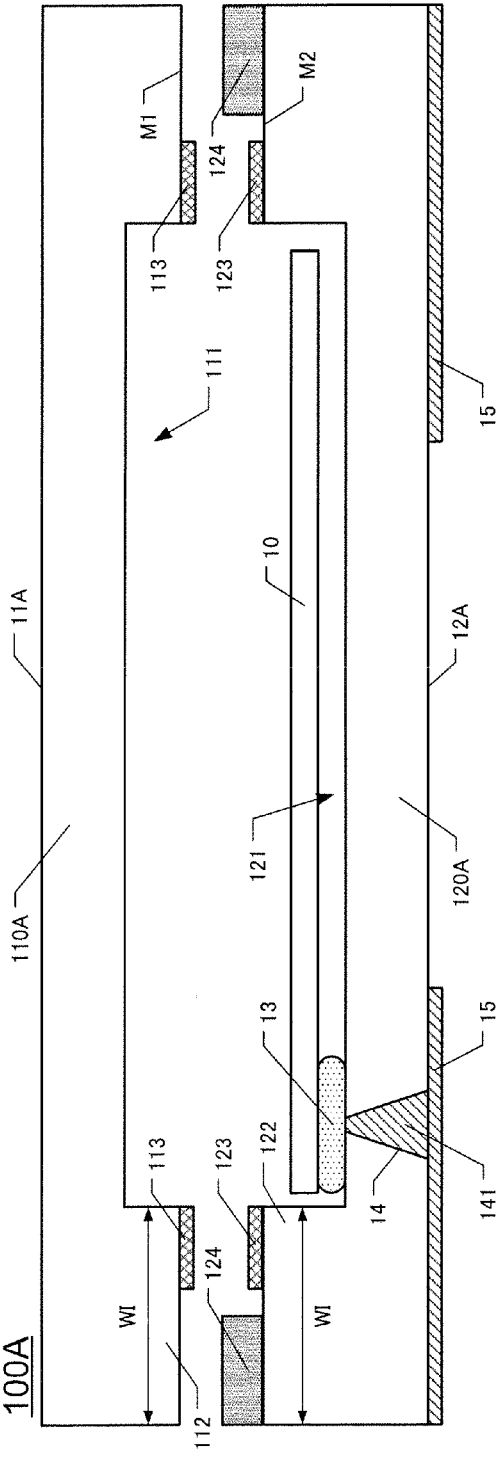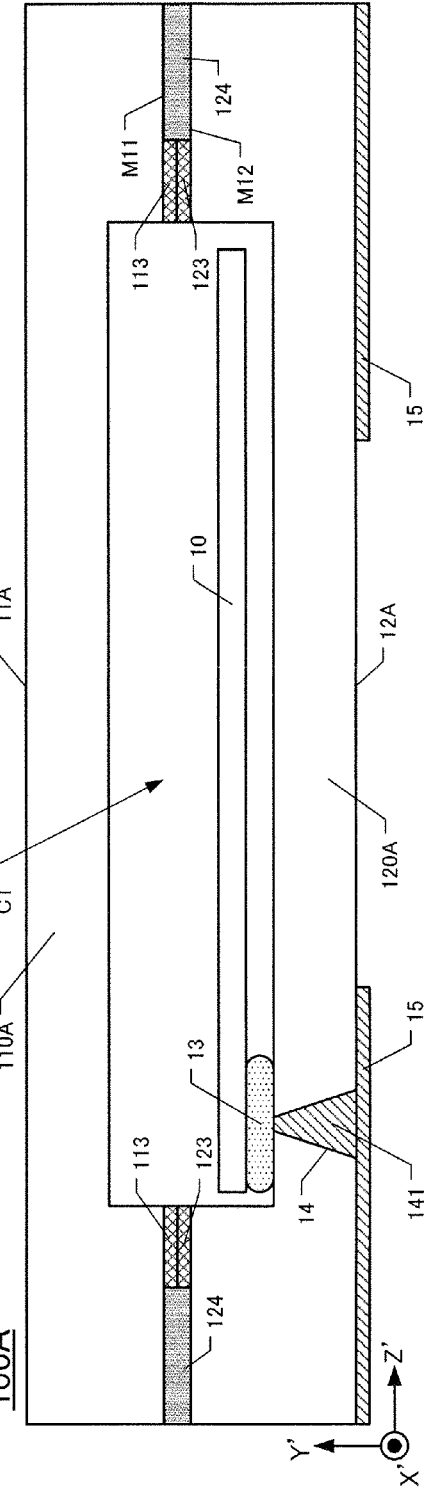

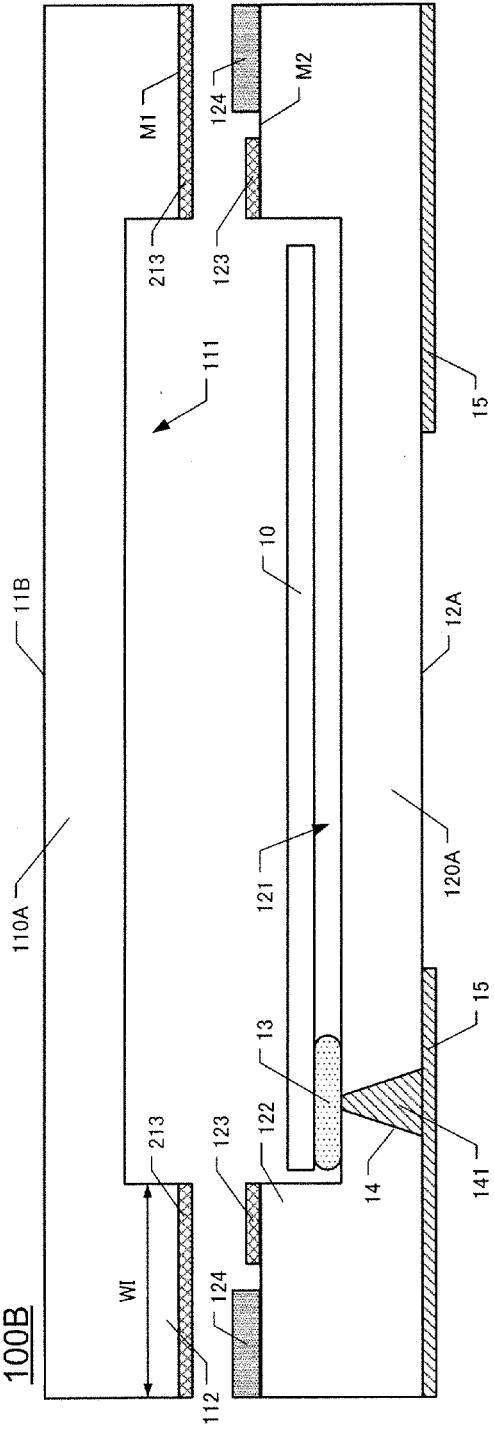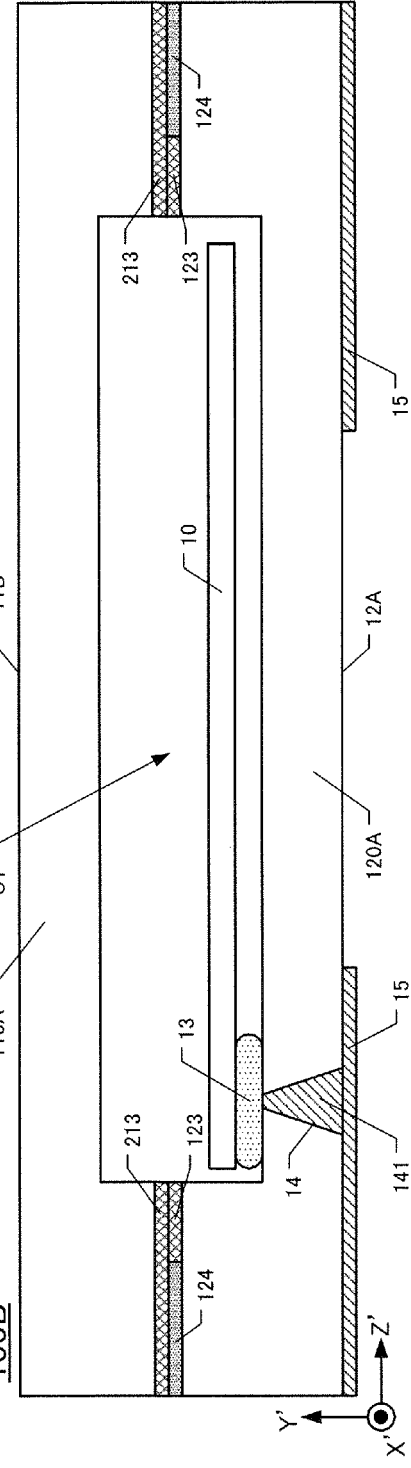

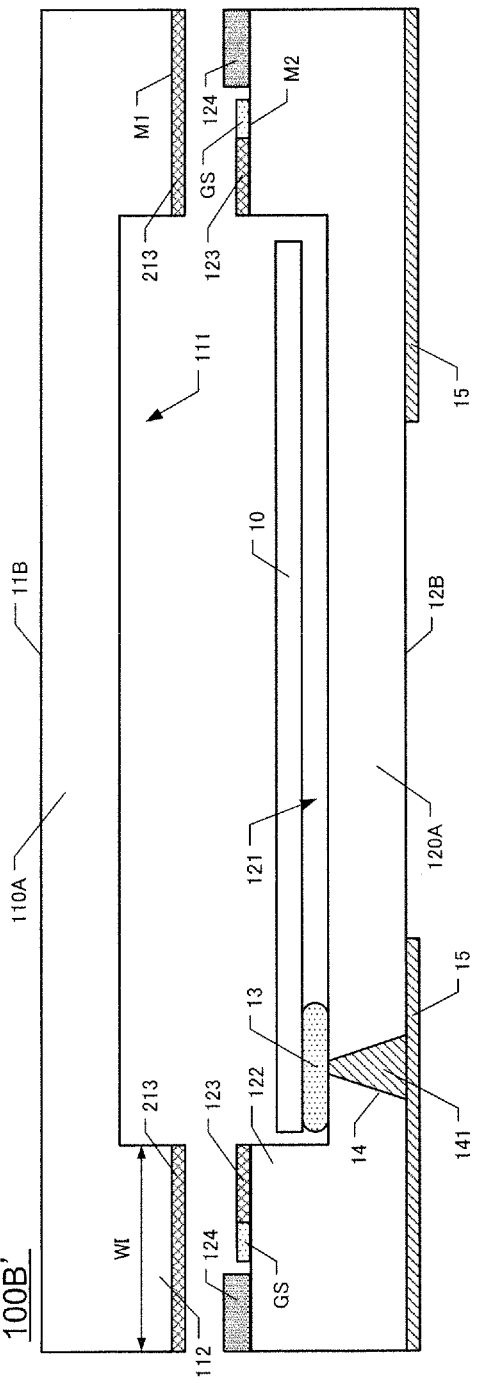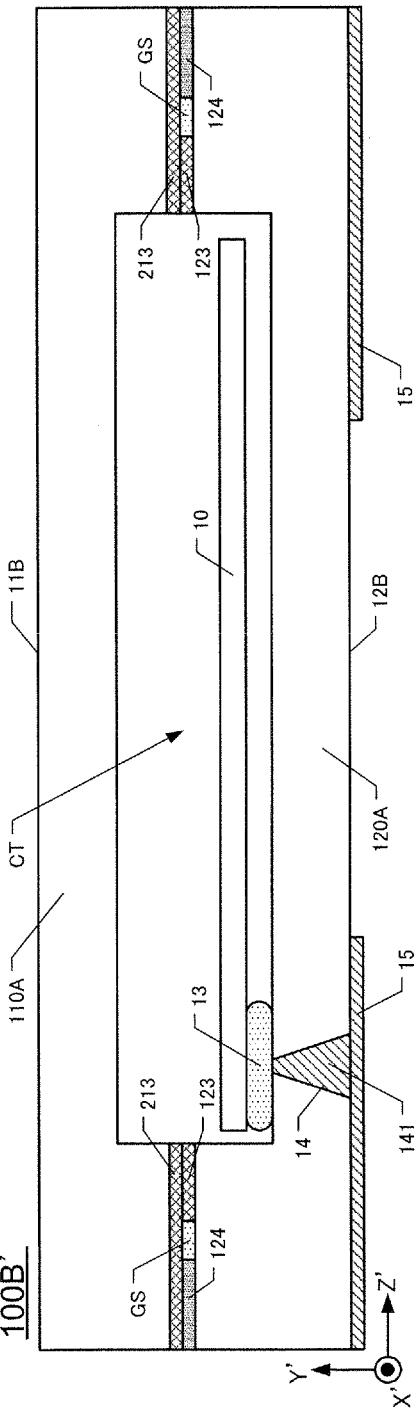

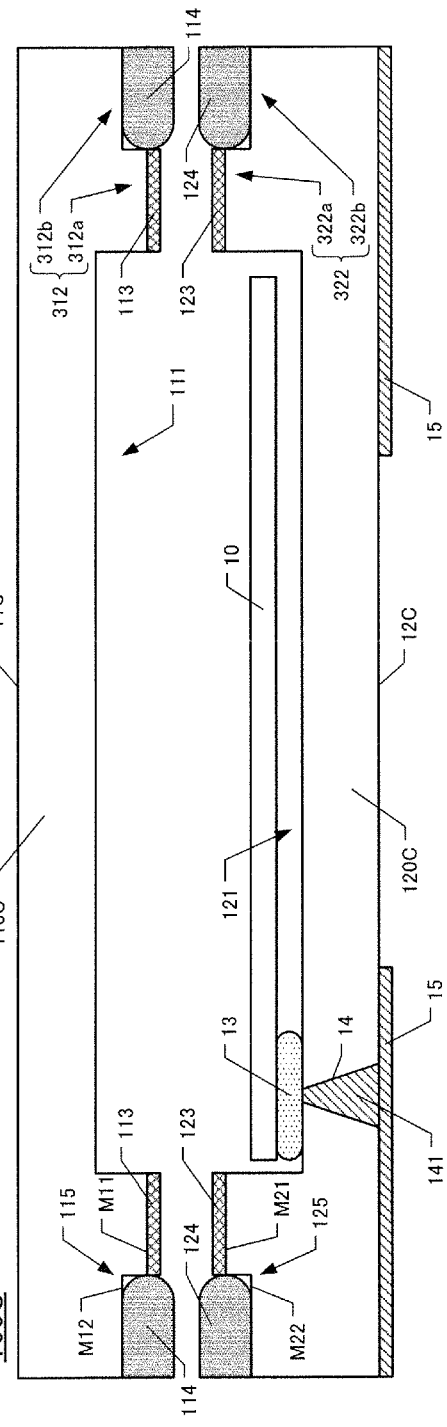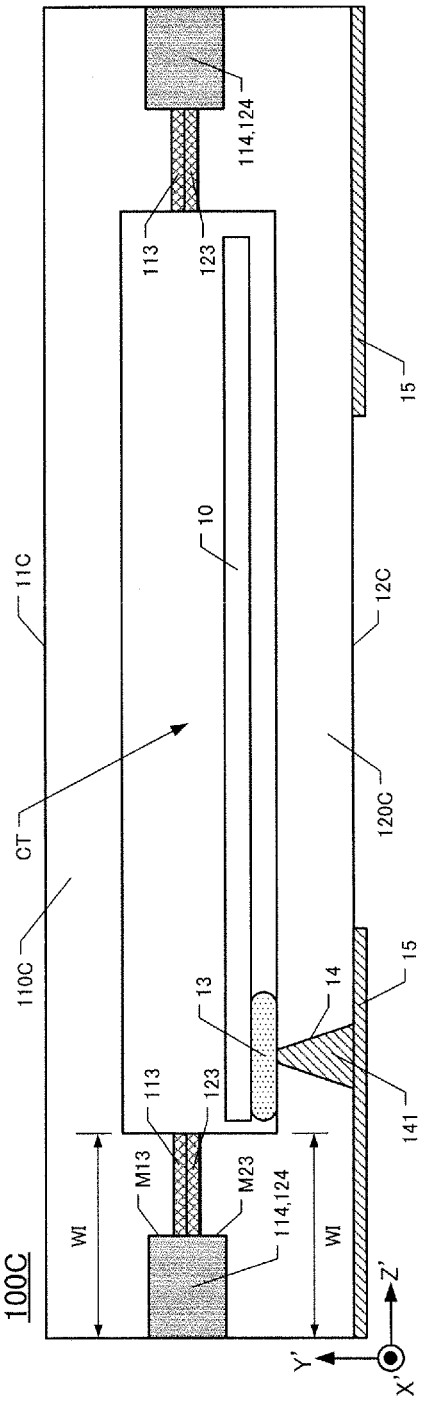

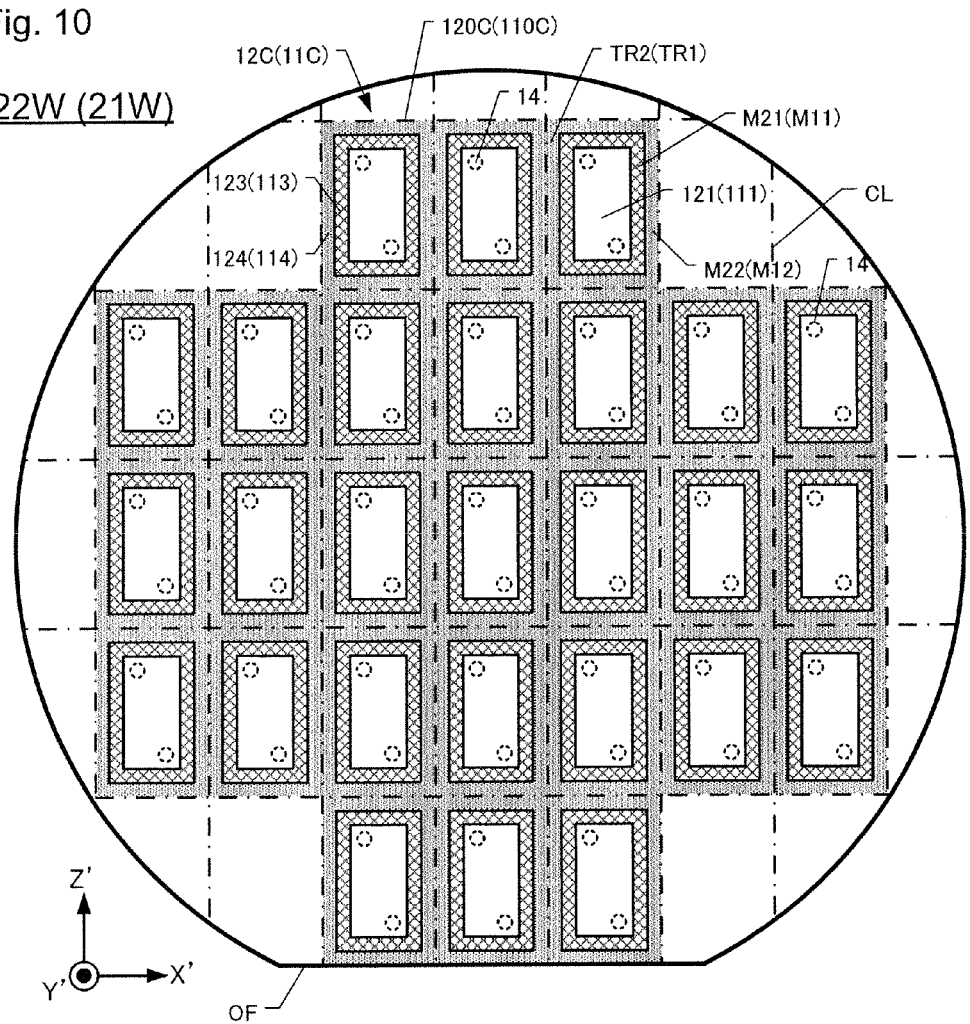

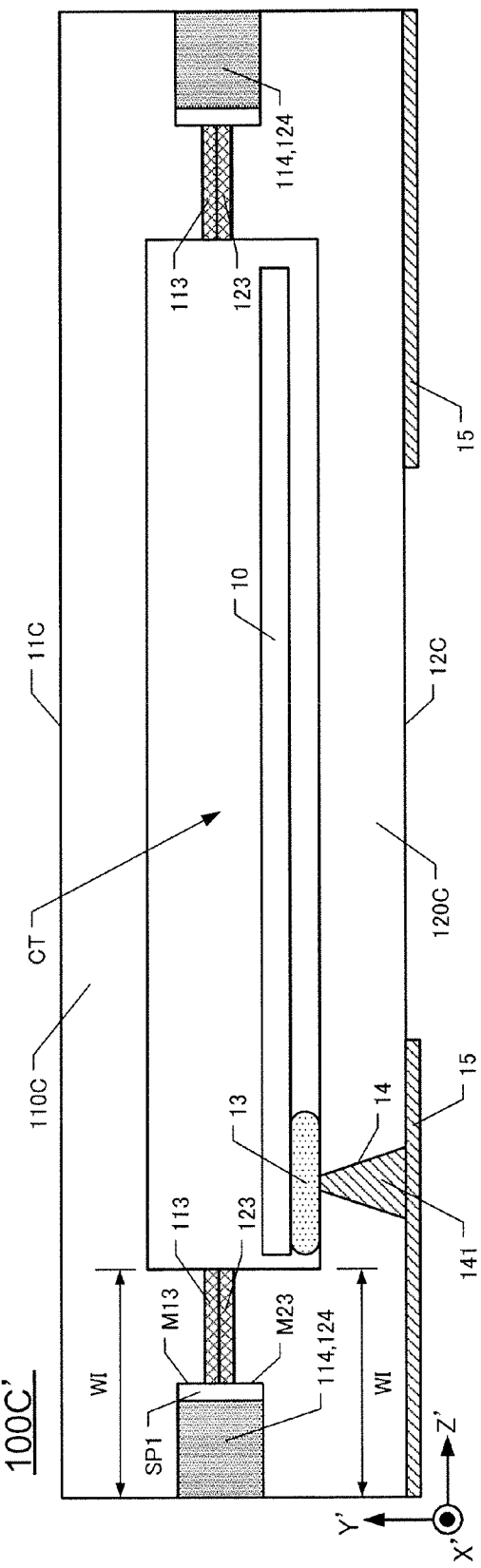

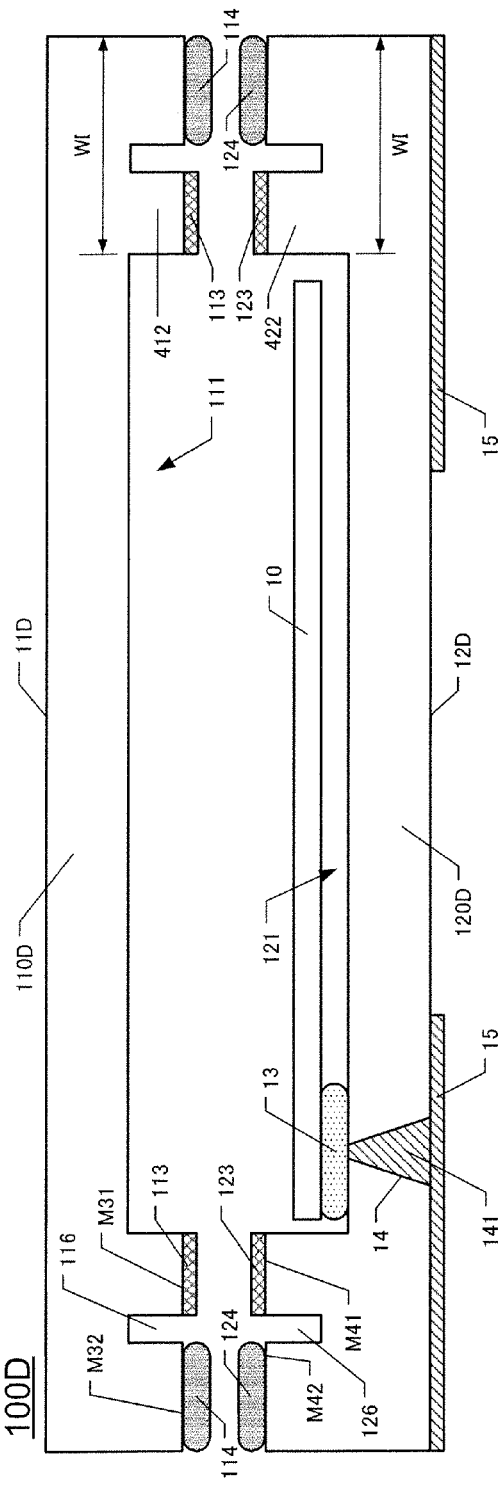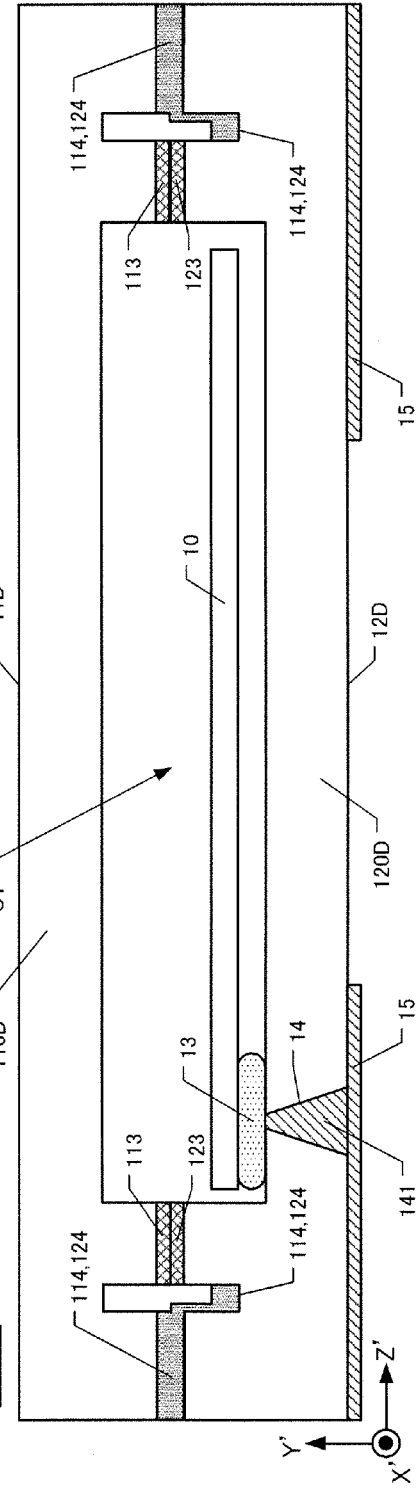

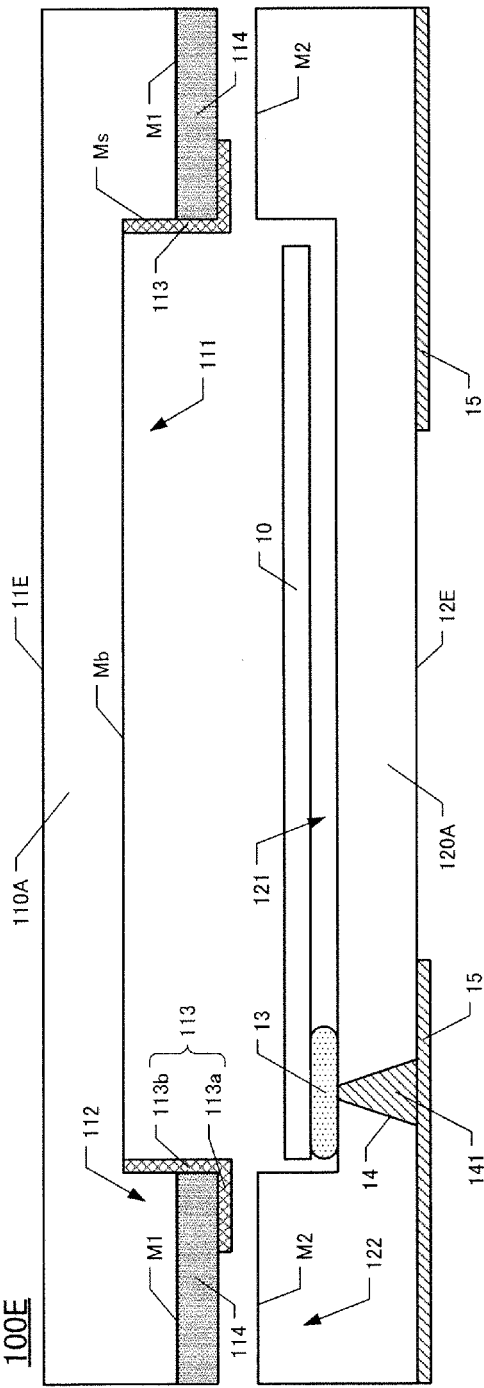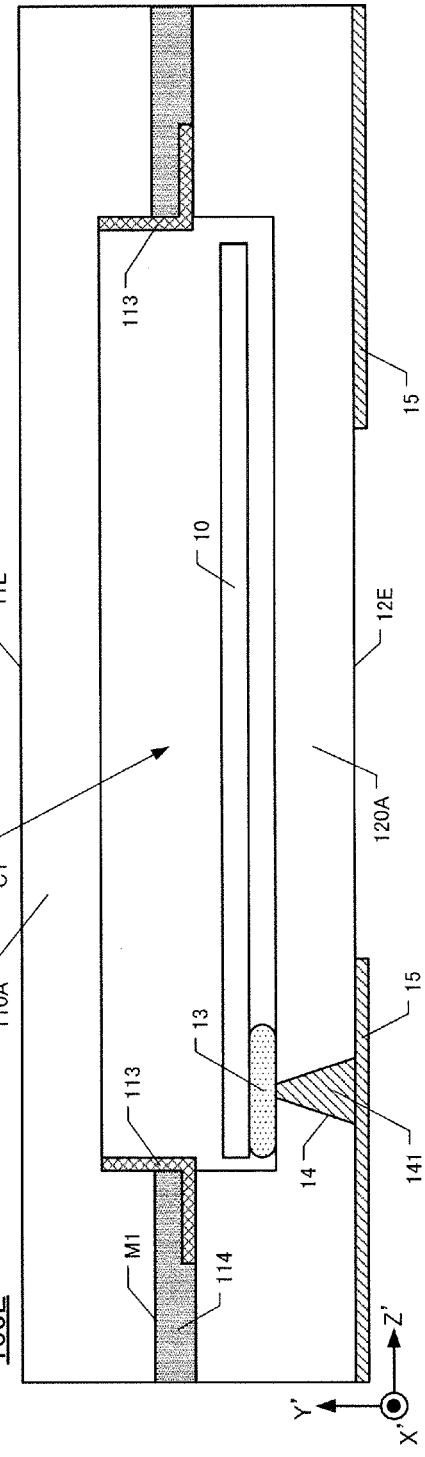
Fig. 13A
100E
Fig. 13B
100E

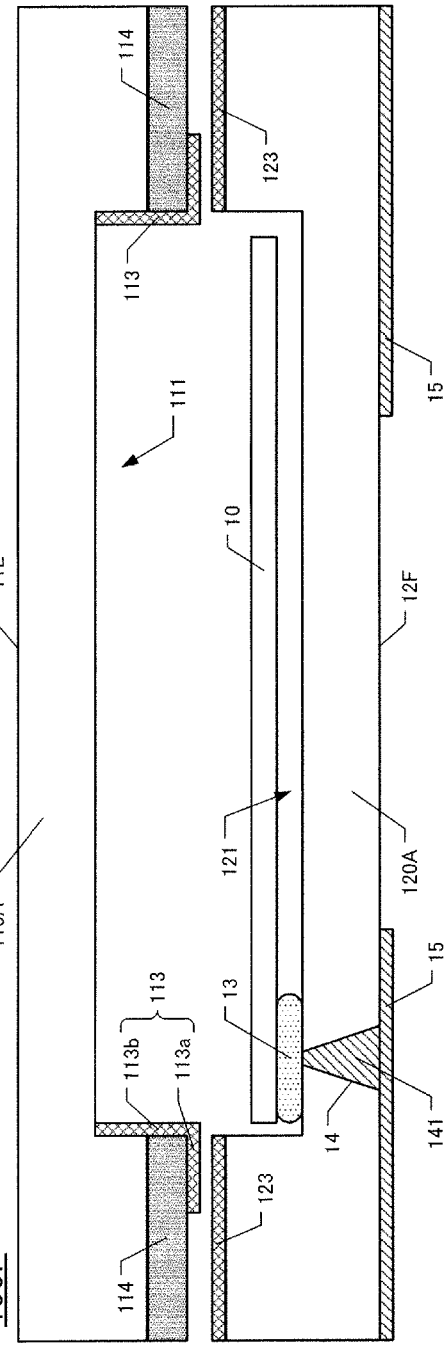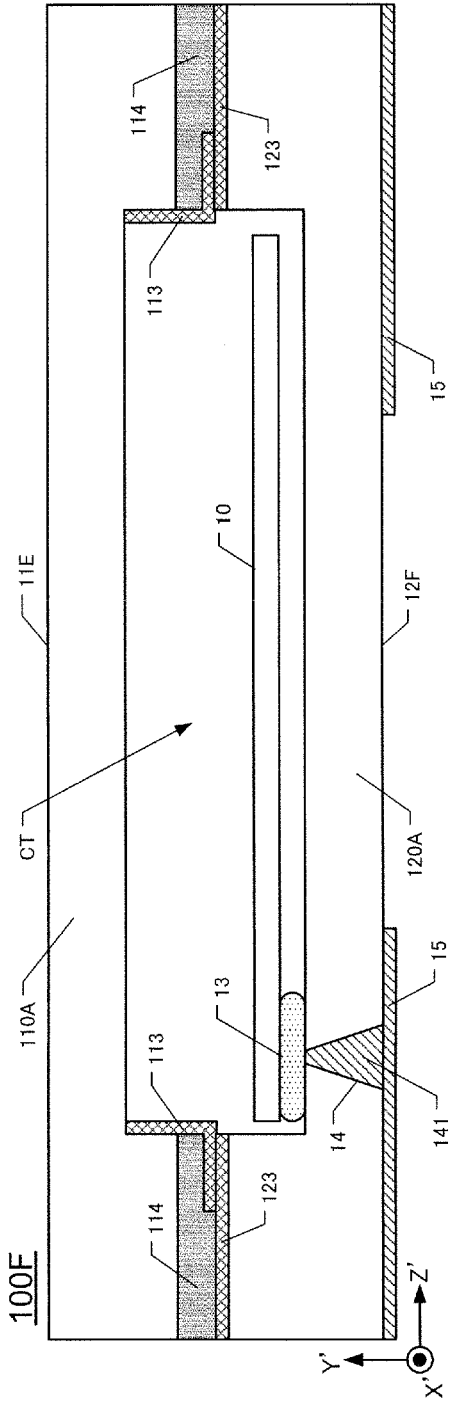

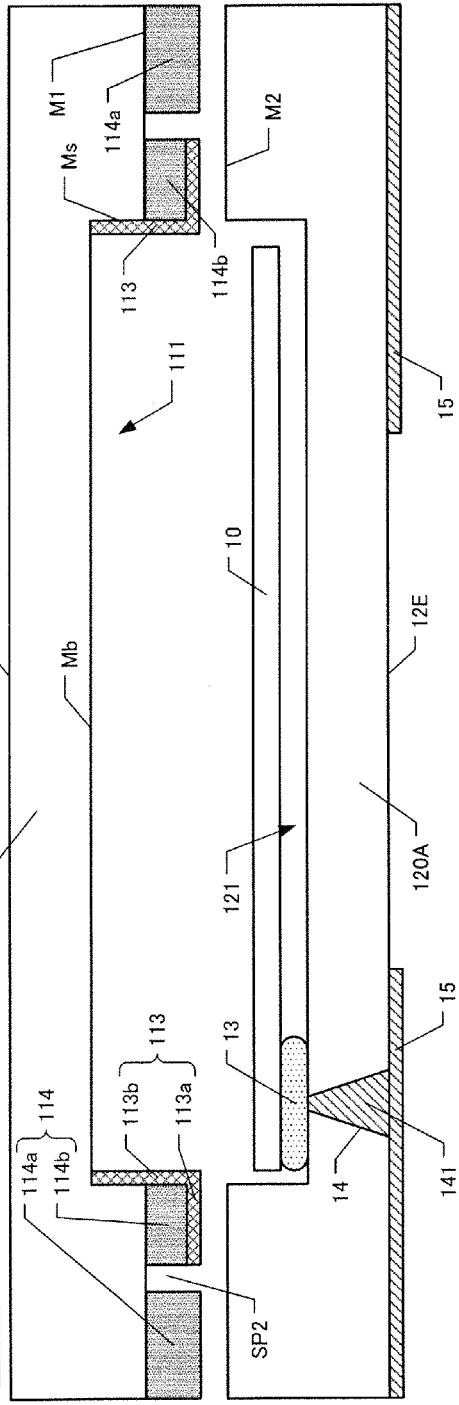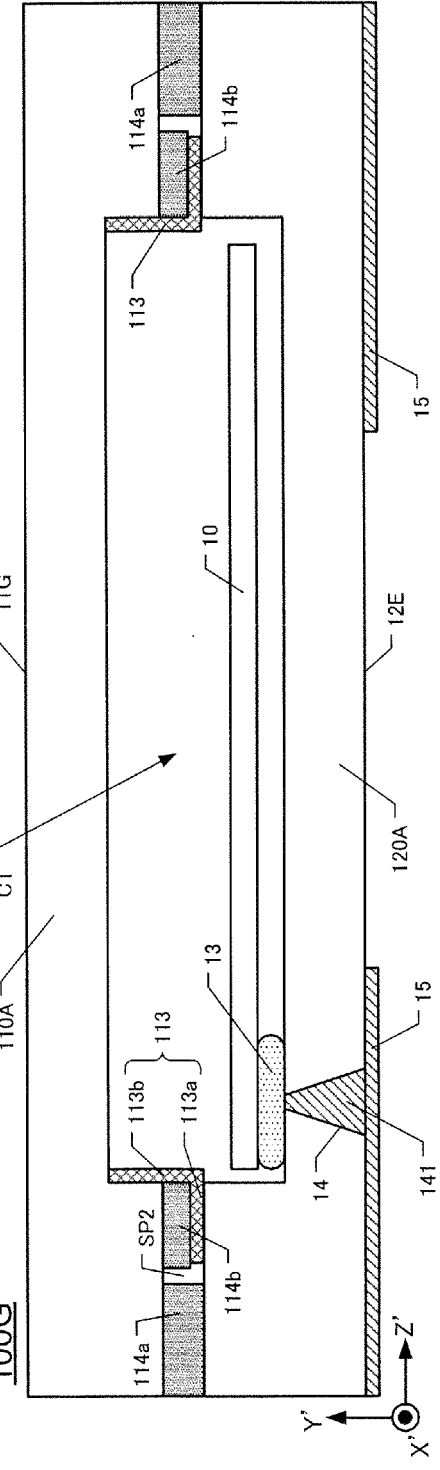

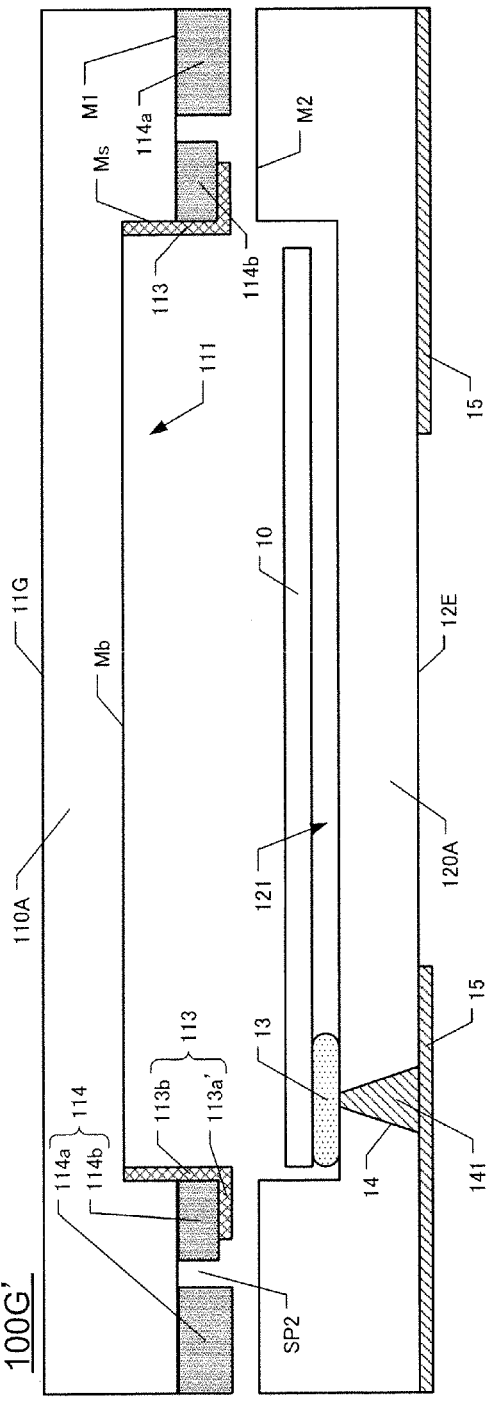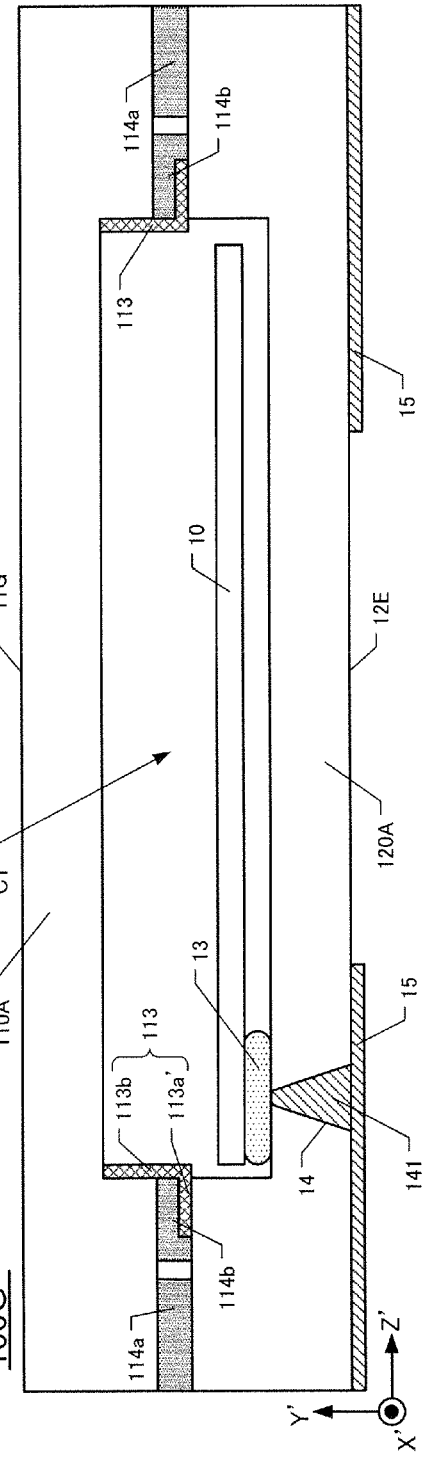

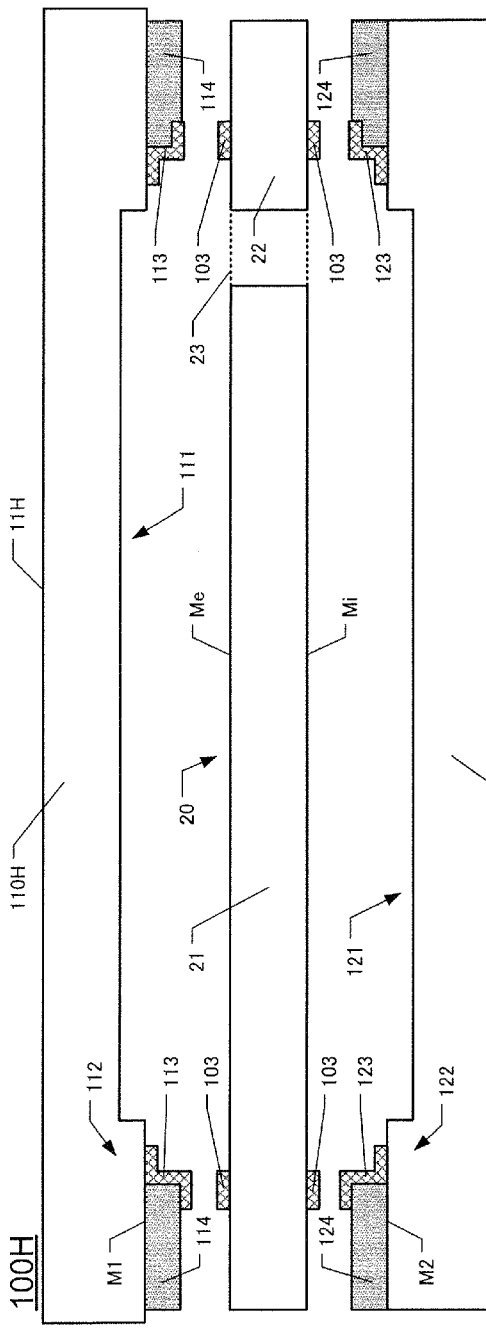
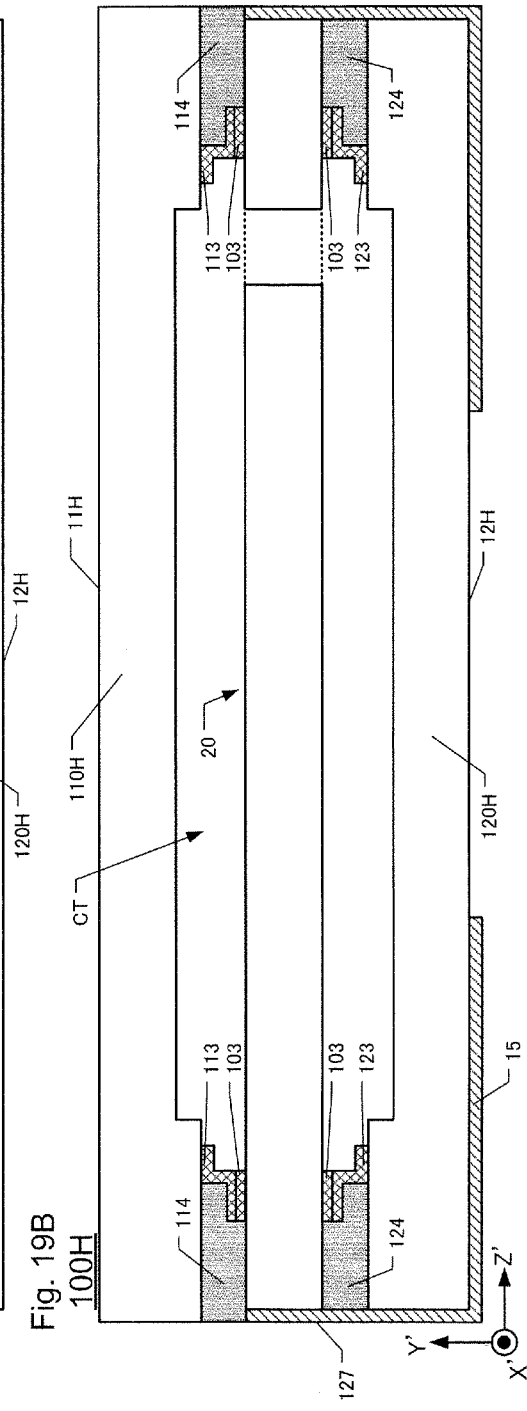

20W

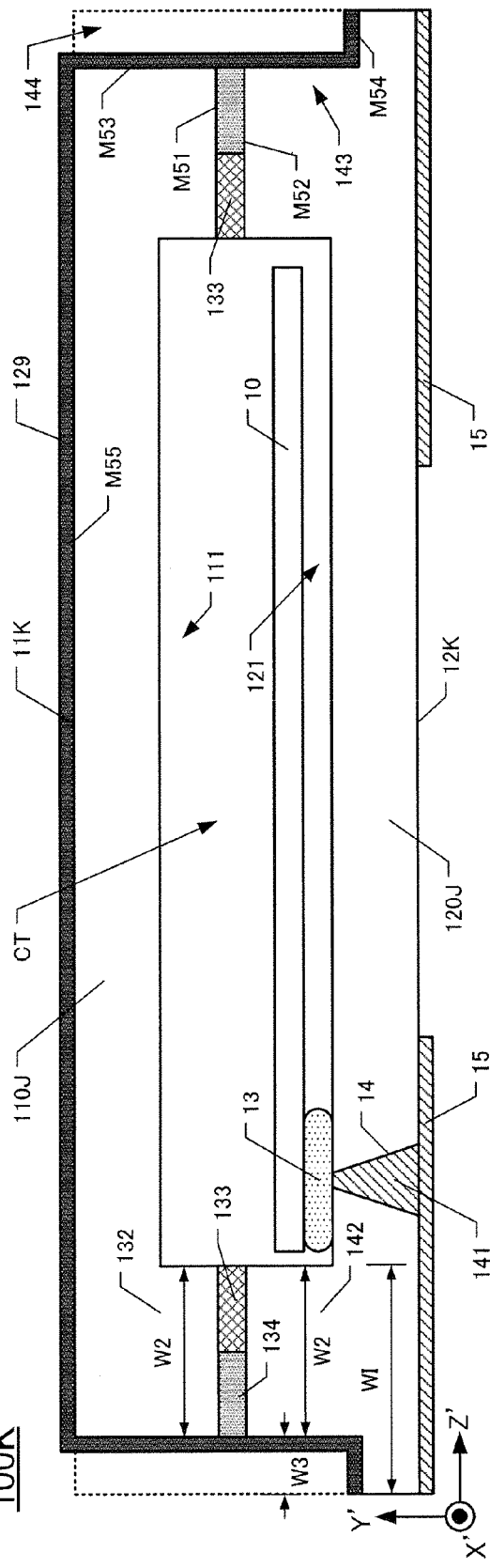

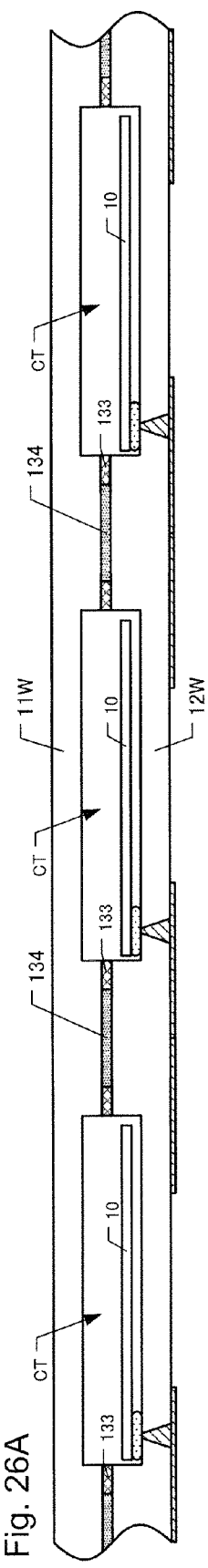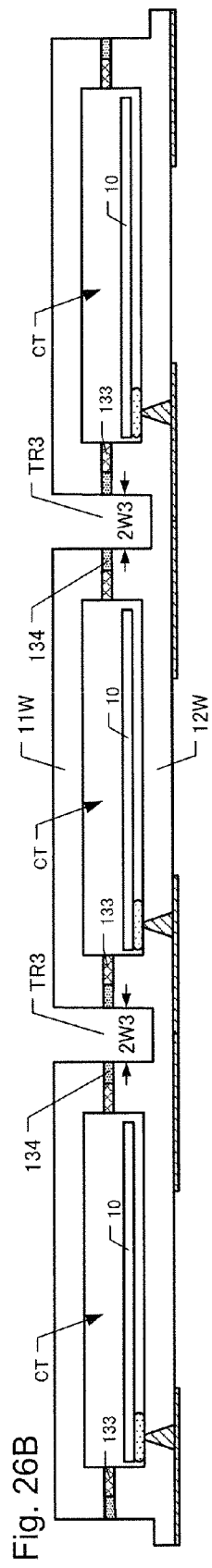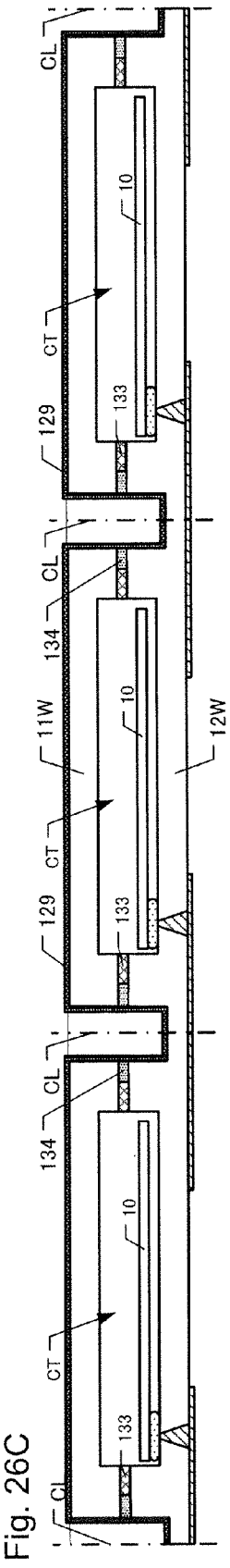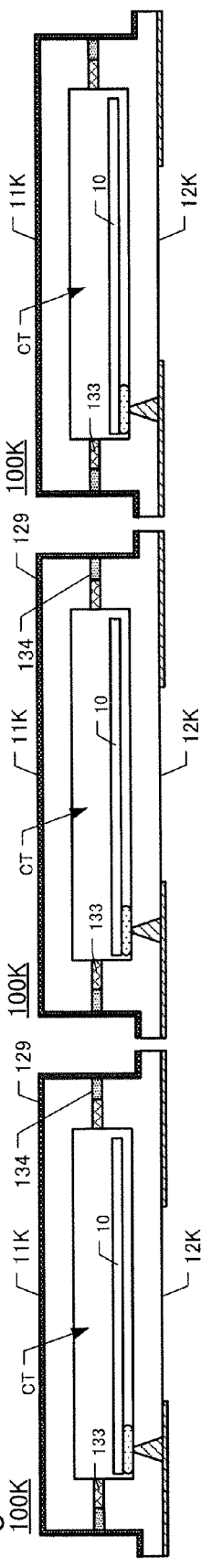

PIEZOELECTRIC VIBRATING DEVICES AND METHODS FOR MANUFACTURING SAME

CROSS-REFERENCE TO RELATED APPLICATION

This application claims priority to and the benefit of Japan Patent Application No. 2010-142197, filed on Jun. 23, 2010, in the Japan Patent Office, the disclosure of which is incorporated herein by reference in its entirety.

FIELD

This disclosure pertains to, inter alia, piezoelectric vibrating devices having an AT-cut piezoelectric vibrating piece that vibrates in the thickness-shear vibration mode or a tuning-fork type piezoelectric vibrating piece having a pair of vibrating arms contained inside a cavity defined by a package. This disclosure also pertains to methods for manufacturing such devices.

DESCRIPTION OF THE RELATED ART

In many conventional piezoelectric devices, a piezoelectric vibrating piece is mounted in a cavity defined by a package comprising a lid bonded to a base using an organic resin adhesive. Unfortunately, gas is produced by the organic resin adhesive whenever the lid is being hermetically bonded to the base. Production of this gas adversely affects the airtightness of the cavity, particularly whenever the gas enters or is entrapped in the cavity, which may occur during manufacture.

Japan Utility Model No. H04-23326 discusses a method for bonding together a lid and a base to form a package defining a cavity. A metal film is formed between bonding surfaces of the lid and the base, followed by bonding together the metal films using a sealing agent. The sealing agent comprises a wax and an organic resin adhesive. The wax is formed on the cavity, and the organic resin is formed outside the wax. The wax is used for preventing gas generated by the organic resin adhesive from entering the cavity as the lid and base are being hermetically sealed together. Unfortunately, this method is costly.

In view of the foregoing, this disclosure is directed to piezoelectric devices, in which a metal film prevents gas produced by the organic resin from entering the cavity. This disclosure is also directed to methods for manufacturing such piezoelectric devices.

SUMMARY

The invention as disclosed herein has several aspects, of which a first aspect pertains to piezoelectric devices. An exemplary embodiment of such a piezoelectric device comprises a piezoelectric vibrating piece that vibrates whenever it is electrically energized. The piezoelectric vibrating piece is contained in a package defined by a first package plate and a second package plate. The first package plate defines a main recess or concavity occupied by the piezoelectric vibrating piece. The first package plate also includes a peripheral surface surrounding the main recess. The package also comprises a second package plate hermetically bonded to the peripheral surface of the first package plate. The first and second package plates are bonded together using an adhesive that is applied as a band that surrounds the peripheral surface. An adjacent band of metal film prevents gas generated by the adhesive from flowing into the main recess. The band of metal film also surrounds the peripheral surface but is disposed inboard of and adjacent the band of adhesive. Desirably, the adhesive is a polyimide resin.

The metal film desirably comprises a foundation metal layer and an overlying gold (Au) layer. The foundation layer bonds directly and strongly to the first and second package plates.

In some embodiments, the foundation layer is formed on the main surfaces of the first and second package plates, while the gold layer is selectively formed between the respective foundation layers along lines of contact of the first package plate with the second package plate. The metal-film bands in these embodiments extend between the first package plate and the adhesive or between the second package plate and the adhesive.

In other embodiments, the foundation layer of the metal-film band extends either between the first package plate and the band of adhesive or between the second package plate and the band of adhesive.

The second package plate can include a bonding region bonded to the peripheral surface of the first package plate. In such embodiments, either the peripheral surface of the first package plate or the peripheral surface of the second package plate defines a circumferential edge recess. The edge recess is a concavity that extends toward the outer edge of the first package plate or toward the outer edge of the second package plate. The concavity is deeper than the first peripheral surface or the bonding region. The first package plate and the second package plate are bonded together by the adhesive applied in the edge recess. The edge recess desirably is well displaced from the inner walls of the main recess.

In some embodiments the peripheral surface is divided by a gap extending around the peripheral surface. The gap prevents adhesive from flowing onto the metal film while bonding the first package plate and the second package plate together.

The band of metal film can be configured with a horizontal portion and a vertical portion. The horizontal portion is parallel with the planes of the main surfaces of the package plates and to the plane of the peripheral surface, and the vertical portion is contiguous with and vertical to the horizontal metal film. The vertical portion is bonded to an inner wall of the main recess in the first package plate. The band of adhesive extends to inside the peripheral surface and contacts both the vertical portion of the metal film at the peripheral surface and the horizontal portion.

The band of adhesive can comprise an inboard band of adhesive and an outboard band of adhesive. The inboard band is disposed on the vertical portion of the metal film and also on the horizontal portion. Meanwhile, the outboard band of adhesive is disposed outboard of the vertical portion of the metal film or outboard of the horizontal portion of the metal film, and separated from the inboard band of adhesive by a gap.

In other embodiments an edge recess, or "notch," extends peripherally around the piezoelectric device. The edge recess as defined by the second package plate extends into the first package plate, but not sufficiently to cut through the first plate. The edge recess is filled with glass, desirably a low-melting-point glass having a lower melting point than either the first package plate or the second package plate.

In other embodiments the edge recess extends as summarized above, while an outer metal film extends onto the interior surfaces of the edge recess. The outer metal film desirably comprises a foundation layer and an overlying gold (Au) layer. The foundation layer is bonded to the first package plate or the second package plate.

In some embodiments a band of low-melting-point glass extends between each band of metal film and corresponding adjacent band of adhesive.

A piezoelectric device according to another embodiment comprises a piezoelectric vibrating piece that vibrates when electrically energized. A piezoelectric frame surrounds the piezoelectric vibrating piece and is contiguous with the piezoelectric vibrating piece. The piezoelectric frame has first and second principal surfaces. A first package plate is bonded to the first principal surface of the frame by an adhesive. A second package plate is bonded to the second principal surface of the frame so as to seal the piezoelectric vibrating piece inside a package formed by the first and second package plates. The adhesive is configured as a band that extends around the first principal surface. A band of metal film, that prevents gas generated from the adhesive from flowing into the recess, extends inboard of the adhesive band on the first principal surface. The adhesive desirably comprises a polyimide resin. The metal film can comprise a foundation layer and an overlying gold (Au) layer. The metal film is bonded to the first package plate or the piezoelectric frame via the foundation layer.

The piezoelectric vibrating piece can be configured as a vibrating piece that undergoes thickness-shear vibration when electrically energized or as a tuning fork having a pair of vibrating arms that vibrate when electrically energized.

According to another aspect, methods are provided for manufacturing piezoelectric devices. An embodiment of such a method comprises preparing multiple piezoelectric vibrating pieces that vibrate when electrically energized. A first package-plate wafer is prepared that includes multiple first package plates each defining a main recess in which the piezoelectric vibrating piece can be is mounted. The main recess is surrounded by a peripheral surface. A band of metal film is formed so as to surround the peripheral surface. A band of adhesive is formed outboard of the band of metal film. A second package-plate wafer is prepared that includes multiple second package plates each having the same size as the first package plates. The piezoelectric vibrating pieces are mounted in respective main recesses, then the first and second package-plate waters are co-aligned and compressed together. The band of metal film prevents gas generated from the adhesive from flowing to the piezoelectric vibrating piece. The compression seals the piezoelectric vibrating piece hermetically.

In some embodiments preparing the first package-plate wafer includes forming a first groove between respective adjacent first package plates. The first grooves are deeper (i.e., have less height) than the peripheral surface and extend in straight lines. The first grooves are filled with adhesive, followed by a preliminary cure of the adhesive.

Some embodiments further include fanning second grooves around the periphery of the piezoelectric devices. These grooves extend depthwise from the second package plate to the first package plate, but do not cut completely through the thickness dimension of the first package-plate wafer. These grooves are formed after the wafer-bonding step. In some embodiments molten glass is applied so as to enter the second grooves. The glass is hardened, followed by cutting through the glass and first and second package plates to separate individual vibrating devices.

Some embodiments of the method further include forming the second groove around the periphery of the piezoelectric device. The second grooves extend depthwise from the second package plate to the first package plate, but do not cut completely through the thickness of the first package-plate wafer. The second grooves can be formed after bonding. A metal film is applied in and along the second grooves, followed by cutting through the metal film and first and second package plates to separate individual vibrating devices.

For bonding the adhesive, the first and second package plates desirably are heated and compressed against each other at a temperature exceeding 300° C.

In some embodiments residue found on the surface of the metal film is removed so as to clean the metal film before commencing bonding. This facilitates bonding together of the metal films brought by the compression into contact with each other.

Piezoelectric devices and methods as summarized above achieve reduced item cost and better performance compared to conventional vibrating devices and methods.

BRIEF DESCRIPTION OF THE DRAWINGS

FIG. 2A is an elevational section of the first embodiment before the package lid and package base are bonded together.

FIG. 2B is an elevational section of the first embodiment after the package lid and the package base have been bonded together.

FIG. 6A is an elevational section of a second embodiment of a quartz-crystal vibrating device before the package lid and package base have been bonded together.

FIG. 6B is an elevational section of the second embodiment after the package lid and the package base have been bonded together.

FIG. 7A is an elevational section of an alternative configuration of the second embodiment of a quartz-crystal vibrating device 100B' before the package lid 11B and package base 12B have been bonded together.

FIG. 7B is an elevational section of the alternative configuration 100B' after the package lid 11B and the package base 12B have been bonded together.

FIG. 8A is an elevational section of a third embodiment of a quartz-crystal vibrating device before the package lid and the package base have been bonded together.

FIG. 8B is an elevational section of the third embodiment after the package lid and package base have been bonded together.

FIG. 10 is a plan view of a lid wafer or base wafer of the third embodiment.

FIG. 11 is an elevational section of an alternative configuration of the third embodiment of a quartz-crystal vibrating device after the package lid and package base have been bonded together.

FIG. 12A is an elevational section of a fourth embodiment of a quartz-crystal vibrating device before the package lid package base have been bonded together.

FIG. 12B is an elevational section of the fourth embodiment after the package lid and the package base have been bonded together.

FIG. 13A is an elevational section a fifth embodiment of a quartz-crystal vibrating device 100E before the package lid 11E and the package base 12E are bonded together.

FIG. 13B is an elevational section of the fifth embodiment after the package lid and package base have been bonded together.

FIG. 15A is an elevational section of the sixth embodiment of a quartz-crystal vibrating device before the package lid and the package base have been bonded together.

FIG. 15B is an elevational section of the sixth embodiment after the package lid and package base have been bonded together.

FIG. 16A is an elevational section of a seventh embodiment of a quartz-crystal vibrating device before the package lid and package base have been bonded together.

FIG. 16B is an elevational section of the seventh embodiment after the package lid and the package base have been bonded together.

FIG. 17A is an elevational section of an alternative configuration of the seventh embodiment of a quartz-crystal vibrating device before the package lid and package base have been bonded together.

FIG. 17B is an elevational section of the alternative configuration of the seventh embodiment of a quartz-crystal vibrating device after the package lid and package base have been bonded together.

FIG. 19A is an elevational section of the eighth embodiment before the package lid and package base have been bonded together.

FIG. 19B is an elevational section of the eighth embodiment after the package lid, quartz-crystal frame, and package base have been bonded together.

FIG. 25 is an elevational section of a tenth embodiment of a quartz-crystal vibrating device.

FIGS. 26A-26D depict respective steps in a method for manufacturing the tenth embodiment of a quartz-crystal vibrating device.

DETAILED DESCRIPTION

Representative embodiments are described in detail below with reference to the accompanying drawings. It will be understood, however, that these embodiments are not intended to be limiting in any way.

In the following embodiments, an AT-cut quartz-crystal vibrating piece for use in surface-mounted devices (SMD) is used as a piezoelectric vibrating piece. An AT-cut quartz-crystal vibrating piece as a principal surface (YZ surface) that is tilted 35° 15" along the Y-axis of a quartz-crystal axis (XYZ) in the direction of the Y-axis, from the Z-axis around the X-axis. Thus, in the following description, new axes that are tilted with respect to the axes of the quartz-crystal vibrating piece are denoted as the X'-axis, Y'-axis, and Z'-axis. With respect to height in the Y'-axis direction, a +direction is denoted as high, and a −direction is denoted as low.

First Embodiment of Quartz-Crystal Vibrating Device

Figure 1:
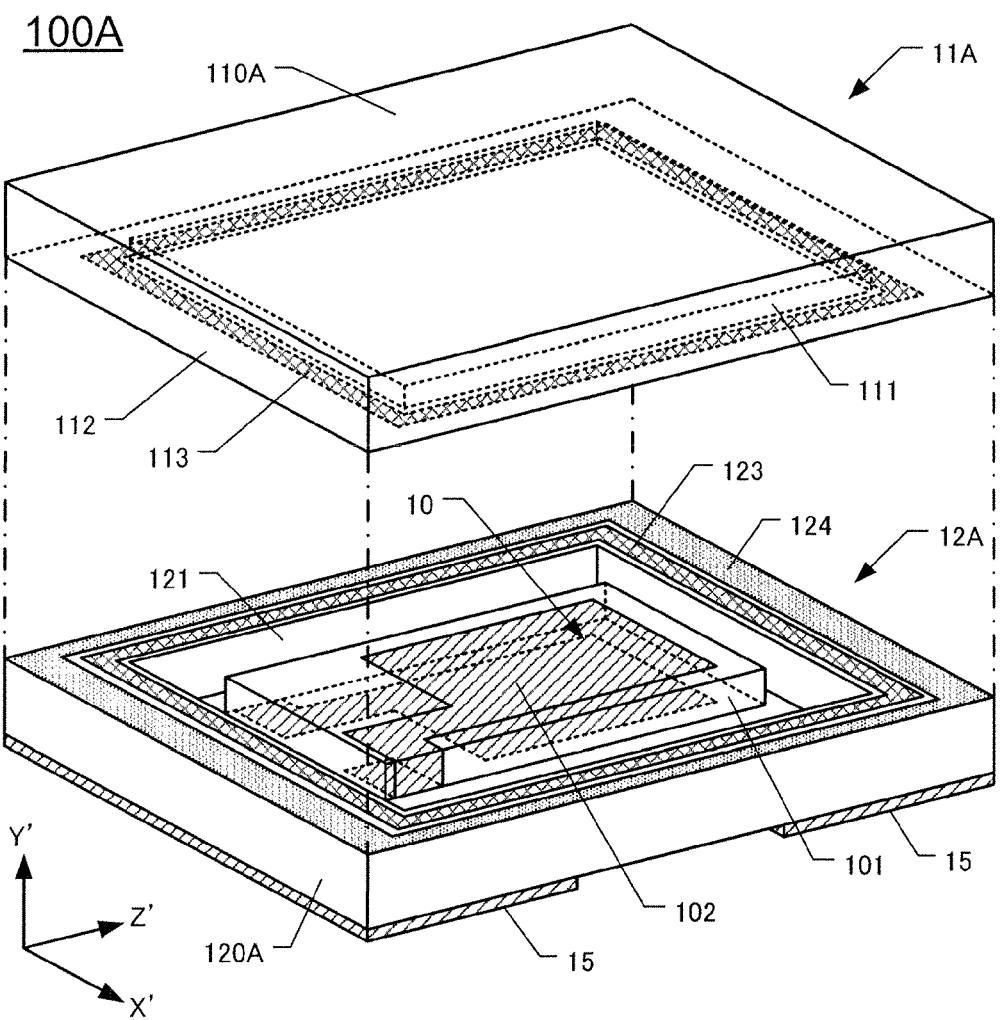
FIG. 1 is an exploded perspective view of a first embodiment of a quartz-crystal vibrating device.

This first embodiment 100A of a quartz-crystal vibrating device is described with reference to FIGS. 1 and 2A-2B. FIG. 1 is an exploded perspective view, FIG. 2A is an elevational section of the vibrating device 100A before bonding the package lid 11A and package base 12A together, and FIG. 2B is an elevational section of the vibrating device 100A after bonding the package lid 11A and package base 12A together.

As shown in FIG. 1, the vibrating device 100A comprises a package lid 11A having an outer (upper) main surface and an inner main surface. The inner main surface defines a concavity that forms a lid recess 111. Similarly, the package base 12A has an outer (lower) main surface and an inner main surface. The inner main surface defines a concavity that forms a base recess 121. A quartz-crystal vibrating piece 10 is mounted in and onto the base recess 121.

The quartz-crystal vibrating piece 10 comprises a vibrating-piece body 101 and a pair of excitation electrodes 102. The vibrating-piece body 101 has an upper and a lower principal surface. A respective excitation electrode 102 is situated centrally on each principal surface so as to oppose each other across the thickness of the vibrating piece. As shown in FIGS. 2A and 2B, the vibrating piece 10 is bonded to the package base 12A using an electrically conductive adhesive 13. The excitation electrodes 102 (FIG. 1) are connected to respective external electrodes 15 formed on the lower main surface of the package base 12A using electrically conductive adhesive 13. Connection electrodes 141 are situated in through-holes 14 extending through the thickness of the package base 12A. Whenever the external electrodes 15 are connected to respective poles of an external power source (not shown), the principal surfaces of the vibrating piece 10 exhibit thickness-shear vibration in which the principal surfaces mutually move in opposite directions. The vibrating piece 10 vibrates at several MHz to several hundred MHz, depending upon the thickness of the vibrating piece.

The package lid 11A has a body 110A fabricated of a piezoelectric material (e.g., quartz crystal) or glass. The lid body 110A defines the lid recess 111, including a protruding portion 112 and a first peripheral surface M1 surrounding the lid recess 111. A metal film 113 having a width WI/2 surrounds the lid recess 111.

The package base 12A has a body 120A fabricated of a piezoelectric material or glass. The base body 120A defines the base recess 121, including a protruding portion 122 and a second peripheral surface M2 surrounding the base recess 121. A metal film 123 having a width WI/2 surrounds the base recess 121.

The metal films 113, 123, and 50 all comprise a layer of gold (Au), having a thickness in the range of 2,000 Å to 3,000 Å, formed on a layer of chromium (Cr) having a thickness in the range of 50 Å to 700 Å. The Cr layer serves as a "foundation" layer for the overlying layer of Au. Alternatively to chromium, a layer of tungsten, nickel, or titanium may be used as the foundation layer.

On the second peripheral surface M2 of the base protruding portion 122, a band of polyimide resin adhesive (hereinafter referred to as "adhesive") 124 is formed outboard of the metal film 123. The adhesive extends completely around the base protruding portion 121 and has an initial width approximately equal to W1/2 and an initial thickness greater than the combined thicknesses of the metal films 113 and 123.

By heating the package lid 11A and the package base 12A at 300° C. to 400° C. in a nitrogen-gas atmosphere or under a vacuum condition, accompanied by compression toward each other, the package lid 11A and the package base 12A become bonded together by the adhesive 124 (FIG. 2B). In the resulting package, the lid recess 111 and base recess 121 collectively form a cavity CT that contains the quartz-crystal vibrating piece 10. The cavity CT can be hermetically filled with nitrogen gas or evacuated to a desired vacuum level.

Although the respective gold layers on the metal films 113 and 123 do not melt at 300° C. to 400° C., the metal bands do experience a reduction in thickness if compressed against each other. Even if the surfaces of these gold layers are uneven, since gold is relatively soft compared to other metals, the contact surfaces of the gold layers even out during compression, without any intervening gaps. Also, the gold layers are not damaged by compression since gold is highly ductile. The absence of gaps between the gold layers prevents incursion of gas (formed by heating the adhesive 124) into the cavity CT.

Even though the adhesive 124 is applied to the package base 12A in this embodiment, the adhesive alternatively can be applied to the package lid 11A or to both the package lid 11A and package base 12. Also, although the metal films 113 and 123 are Rot tiled on both the package lid 11A and package base 12A, the films alternatively can be formed on one or the other.

Figure 3:
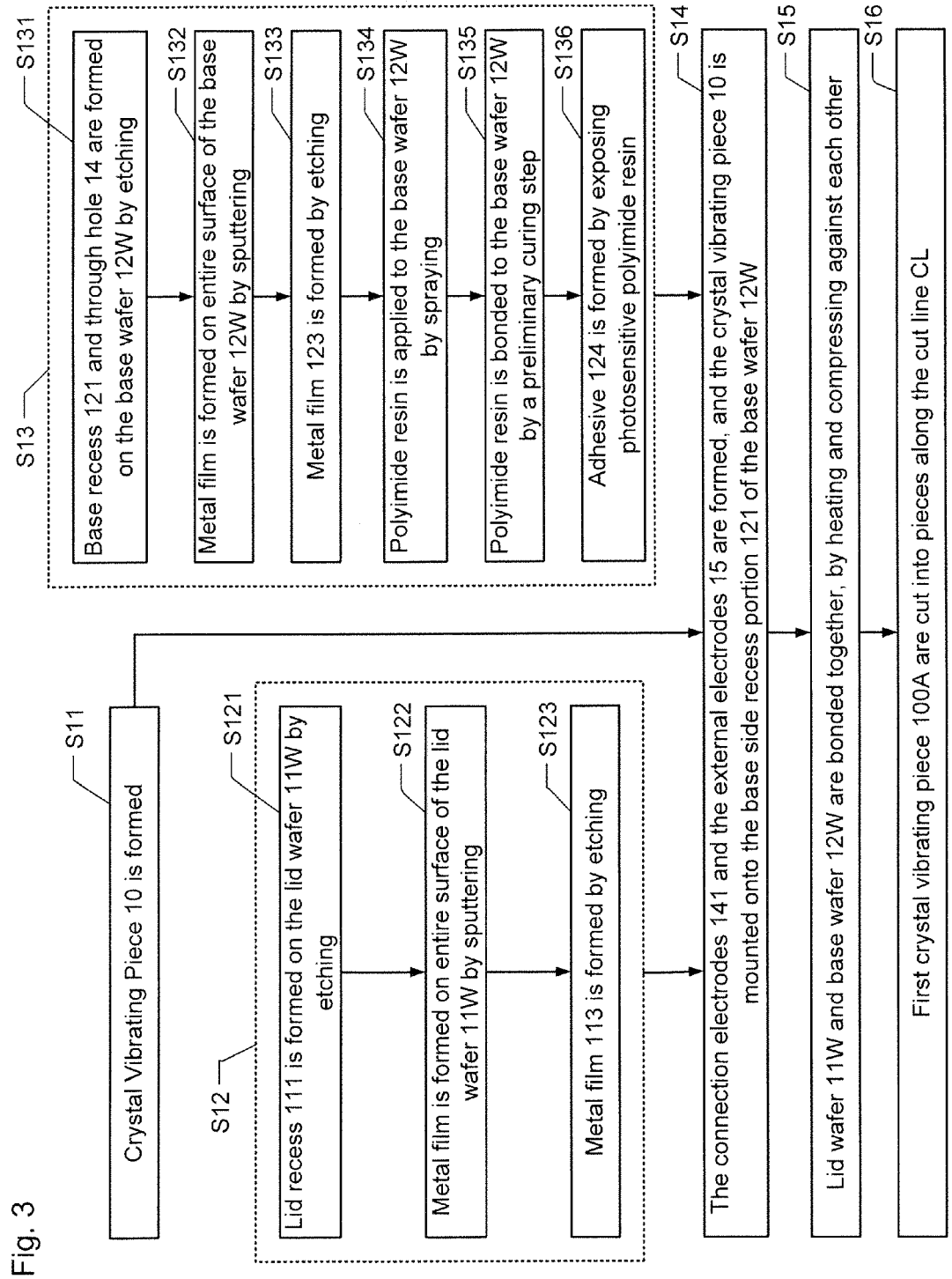
FIG. 3 is a flow-chart of steps of an exemplary embodiment of a method for manufacturing the first embodiment of a crystal vibrating device.
Figure 4:
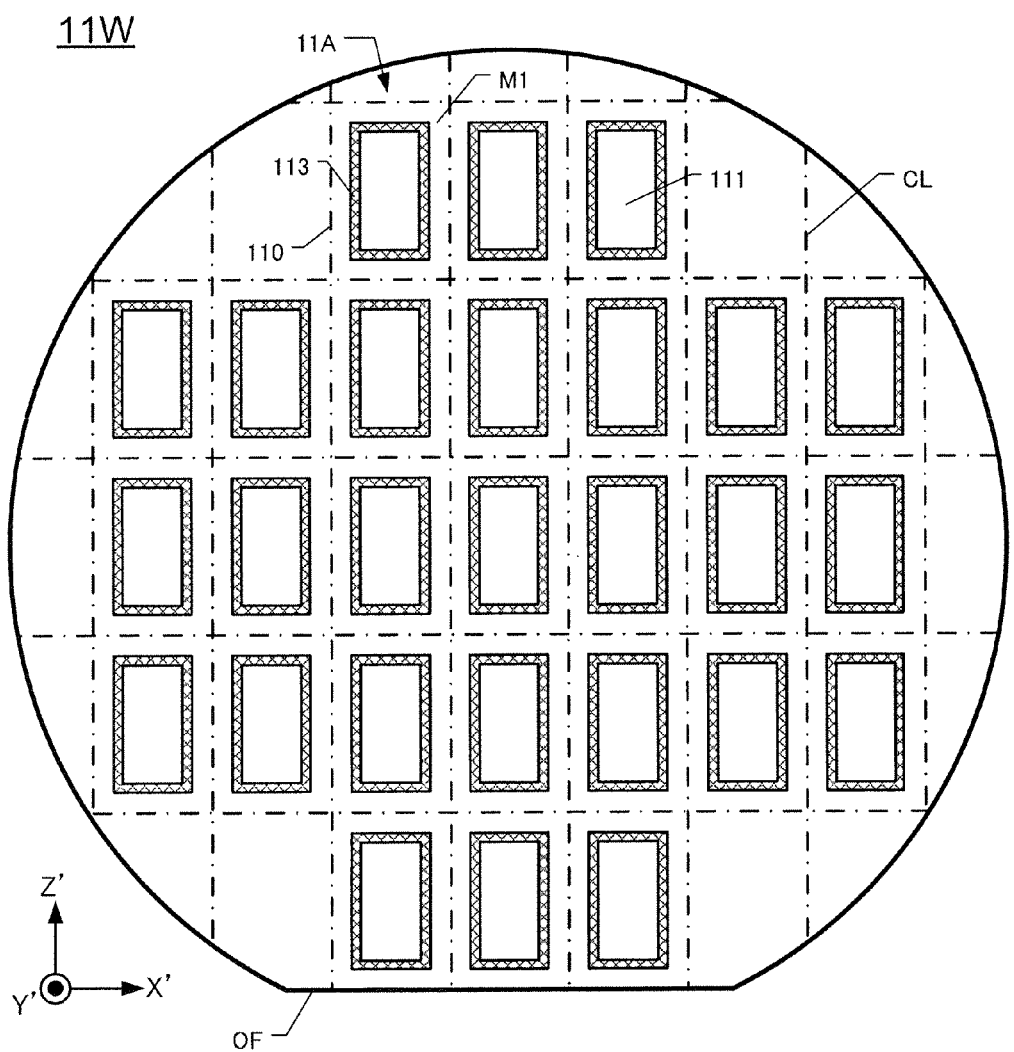
FIG. 4 is a plan view of a lid wafer as used for forming lids used in the first embodiment of a piezoelectric vibrating device.
Figure 5:
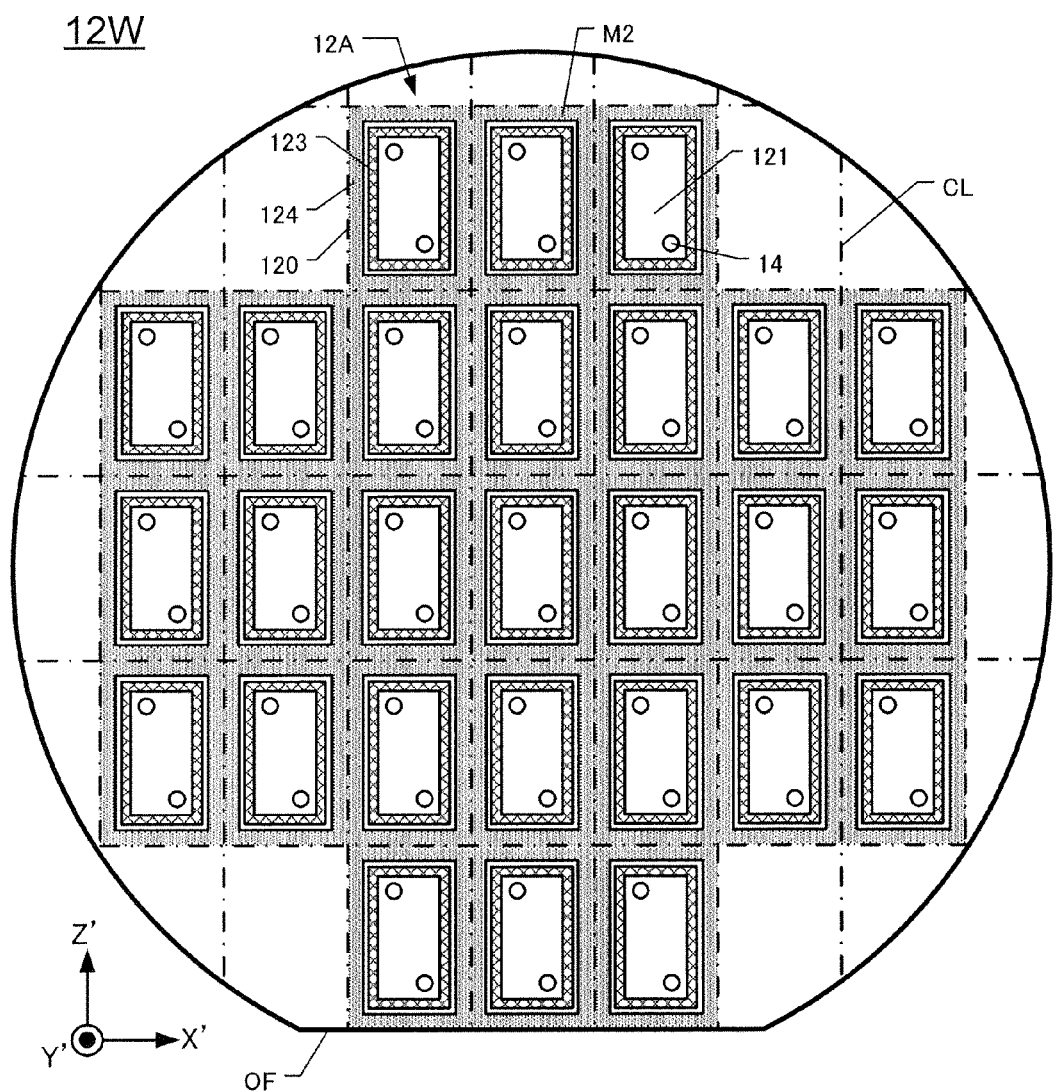
FIG. 5 is a plan view of a base wafer as used for forming bases used in the first embodiment of a piezoelectric vibrating device.

FIG. 3 is a flow-chart of steps in an embodiment of a method for manufacturing the quartz-crystal vibrating device 100A. The method comprises several protocols each comprising at least one step. Protocols S11, S12, and S13 can be performed either serially or in parallel. FIG. 4 is a plan view of a lid wafer 11W used in the method, and FIG. 5 is a plan view of a base wafer 12W used in the method.

In protocol S11 multiple quartz-crystal vibrating pieces 10 (FIG. 1) are formed. Although not detailed in FIG. 3, the protocol S11 is performed as follows: First, on each main surface of a quartz-crystal wafer (not shown), a foundation layer of chromium (Cr) is formed, followed by formation of an overlying layer of gold (Au). These metal layers are formed by sputtering or vacuum-deposition. Then, on each main surface of the quartz-crystal wafer, a respective uniform-thickness photoresist layer (e.g., a positive photoresist called "novolak") is applied by spin-coating. Using an exposure tool (not shown), outline profiles of quartz-crystal vibrating pieces 10 are imprinted in the photoresist layers on each main surface of the wafer. Next, regions of the gold layers denuded by removal of the photoresist are etched away using an aqueous solution of, for example, iodine and potassium iodide. Corresponding denuded regions of the chromium layer are etched away using an aqueous solution of nitric acid and ceric ammonium nitrate. External features of the vibrating pieces 10 are formed by etching corresponding denuded regions of the quartz-crystal wafer. Respective excitation electrodes 102 are formed both main surfaces of the wafer. Then, individual vibrating pieces 10 are cut from the wafer, thereby completing formation of multiple quartz-crystal vibrating pieces 10.

In protocol S12 multiple package lids 11A are manufactured. Protocol S12 includes steps S121, S122, and S123. In step S121, as shown in FIG. 4, several hundreds to several thousands of lids 110A are formed simultaneously on a lid wafer 11W, which is a circular, uniformly planar plate of quartz-crystal material. If the material of the lid wafer 11W is quartz-crystal or glass, a respective lid recess 111 is formed substantially in the center of each lid 110 by etching or mechanical processing. Forming the lid recess 111 in each lid results in formation of a first peripheral surface M1 extending around the periphery of the lid recess 111.

In step S122, a chromium (Cr) foundation layer is formed on the entire surface of the lid wafer 11W, followed by formation of an overlying layer of gold (Au). These metal layers are formed by sputtering or vacuum-deposition.

In step S123, as shown in FIG. 4, a band 113 of metal film is formed on the first peripheral surface M1 surrounding each lid recess 111. The metal film 113 is formed by photolithographic exposure and etching.

In protocol S13, multiple package bases 12A are manufactured. Protocol S13 includes steps S131-S136.

In step S131, as shown in FIG. 5, several hundreds to several thousands of bases 120A are Ruined simultaneously on a base wafer 12W, which is a circular, uniformly planar plate of quartz-crystal material. The base recesses 121 are formed by etching or mechanical processing. Simultaneously, through-holes 14 are formed. Forming the base recess 121 in each base results in formation of a second peripheral surface M2 extending around the periphery of the base recess 121.

In step S132, a foundation layer of chromium (Cr) is formed on the entire surface of the base wafer 12W, followed by formation of an overlying layer of gold (Au). These metal layers are formed by sputtering or vacuum-deposition.

In step S133, as shown in FIG. 5, a band 123 of metal film is formed on the second peripheral surface M2 surrounding each base recess 121. The base recesses 121 are formed by photolithographic exposure and etching. Simultaneously with forming the metal bands 123, extraction electrodes (not shown) are formed on the inner surface of each base recess 121; the extraction electrodes are connected to respective excitation electrodes 102 of the piezoelectric vibrating piece 10 and to respective through-holes 14.

In step S134, a photosensitive polyimide resin 124 is discharged as a mist for application to the base wafer 12W (hereinafter referred as spray-coating). The entire surface of the base wafer 12W is coated uniformly with the polyimide resin.

In step S135, the polyimide resin 124 is bonded to the base wafer 12W by preliminary curing at a temperature of about 250° C. This temperature is sufficient to produce an approximately 75% cure of the resin 124. This resin is used as an adhesive.

In step S136, as shown in FIG. 5, the partially cured photosensitive polyimide resin 124 is exposed and developed to leave the resin only on exterior surfaces of the metal film 123 on the second peripheral surface M2.

In protocol S14, connection electrodes 141 and external electrodes 15 (FIG. 2) are formed. A respective connection electrode 141 is formed in each through-hole 14. External electrodes 15 are formed on the lower main surface of each package base 11A. The external electrodes are connected to respective connection electrodes 141 in the through-holes 14. Afterward, a respective piezoelectric vibrating piece 10, manufactured in protocol S11, is mounted in each base recess 121 using an electrically conductive adhesive 13. The piezoelectric vibrating piece 10 is mounted in the base recess 121 so that the excitation electrodes 102 are aligned with the connection electrodes 141 in the through-holes 14.

In protocol S15, the lid wafer 11W and base wafer 12W are bonded together by application of heat to the adhesive 124 and simultaneous compression of the lid wafer 11W and the base wafer 12W against each other. The lid wafer 11W as shown in FIG. 4 and the base wafer 12W as shown in FIG. 5 have respective orientation flats OF on their outer edges. The orientation flats denote the lattice direction of the quartz-crystal. Using the orientation flats OF as alignment references, the lid wafer 11W manufactured in protocol S12 and the base wafer 13W manufactured in protocol S13 are aligned with each other for bonding. To complete bonding, the adhesive 124 is heated to within a range of 300° C. to 400° C. to achieve full cure.

Referring further to FIG. 2B, the gold layer of the metal film 113 on the first peripheral surface M1 and the gold layer of the metal film 123 on the second peripheral surface M2 contact each other without any intervening gaps during compression of the wafers. Thus, the metal films 113 and 123 prevent gas from entering the cavity CT during the 300° C. to 400° C. heating step. As a result, the piezoelectric vibrating piece 10 in the cavity CT can vibrate more accurately at a specified frequency.

In protocol S16, the bonded lid wafer 11W and base wafer 12W are cut to separate individual vibrating devices 100A from each other. Cuts are made along cut lines CL (denoted by dot-dash lines in FIGS. 4 and 5) using a dicing unit such as a laser beam or a dicing saw. Thus, several hundreds to several thousands of quartz-crystal vibrating devices 100A are produced, each exhibiting a highly accurate vibration frequency.

Second Embodiment of Quartz-Crystal Vibrating Device

FIGS. 6A and 6B are respective elevational sections of a quartz-crystal vibrating device 100B according to this embodiment. FIG. 6A depicts the device before bonding a package lid 11B and a package base 12A together, and FIG. 6B depicts the device after bonding the package lid 11B and the package base 12A together. In this embodiment, components that are similar to corresponding components in the first representative embodiment have the same respective reference numerals.

The vibrating device 100B comprises a piezoelectric vibrating piece 10, a package base 12A, and a package lid 11B bonded to the package base 12A. The package lid 11B includes a lid body 110A fabricated of a piezoelectric material or glass. Regarding the lid 11B, a metal film 213 is formed on the entire first peripheral surface M1 of the lid protruding portion 112.

Starting from the configuration shown in FIG. 6A, as the package lid 11B and package base 12A are compressed together for bonding, the gold layer of the metal film 213 and the gold layer of the metal film 123 contact each other without any intervening gaps. This effectively prevents gas, generated by heating, from entering the cavity CT. As a result, the piezoelectric vibrating piece 10 is situated in the cavity CT can vibrate more accurately.

Although the metal film 213 is formed on the entire first peripheral surface M1 of the lid 110A, it alternatively can be formed on the second peripheral surface M2 of the base 120A, or formed on both the first peripheral surface M1 and the second peripheral surface M2.

Also, although the gold layer is formed on the entire surface of the metal film, it need not be formed in regions destined to be bonded together using adhesive 124 (e.g., first peripheral surface M1 or second peripheral surface M2). In such cases, the adhesive 124 is bonded to the chromium layer of the metal film, thereby connecting together the package lid and package base while conserving gold.

The method for manufacturing package lids 11B according to this embodiment differs from the method for manufacturing quartz-crystal vibrating devices as described in the first embodiment. In particular, the step for forming the metal film 213 is different. In the second embodiment, the metal film 213 is formed on all surfaces of the first peripheral surface M1 of the lid 110A by photolithography and etching.

Alternative to Second Embodiment

FIG. 7A depicts a situation before the package lid 11B and package base 12B are bonded together. FIG. 7B depicts a situation after bonding the package lid 11B to the package base 12B. In this alternative configuration, components that are similar to corresponding components in the second embodiment have the same respective reference numerals.

This alternative configuration is shown in FIG. 7A, depicting the quartz-crystal vibrating device 100B'. Outboard of the metal film 123 on the package base 12B, sealing glass GS is applied around the periphery of the base recess 121, so as to contact the metal film 123. The sealing glass GS is a lead-free vanadium-based glass having an adhesive component that melts at 350° C. to 400° C. The melting point of the sealing glass GS is lower than the melting point of the package lid 11B or the melting point of the package base 12B. Thus, the lead-free, vanadium-based glass is referred as "low-melting-point glass" or "low-mp glass." Low-mp glass forms a highly reliable air-tight seal and resists water and humidity. Also, since the coefficient of thermal expansion of low-mp glass can be controlled effectively by controlling its glass structure, low-mp glass can be bonded to various materials having different respective coefficients of thermal expansion, such as ceramics, glass, semiconductor material, and metal.

As shown in FIG. 7B, the package lid 11B and package base 12B are compressed together to achieve a high-adhesion bond involving both the adhesive 124 and the sealing glass GS. Sealing glass GS situated between the adhesive 124 and the metal film 123 prevents the adhesive 124 from leaking to the metal film 123 during bonding of the package lid 11B and the package base 12B.

Although the sealing glass GS is applied on the package base 12B in this embodiment, it alternatively can be applied on the package lid 11B or on both the package lid 11B and the package base 12B. In FIG. 7B the sealing glass GS is applied so as to contact both the metal film 123 and the adhesive 124. Alternatively, the metal film 123 and the adhesive 124 can be applied with an intervening space between them.

The method for manufacturing the package base 12B of this quartz-crystal vibrating device 100B' is similar in many ways to the method for manufacturing the package base 12A of the vibrating device 100A described in the first embodiment. However, during manufacture of the quartz-crystal vibrating device 100B', after the adhesive 124 is applied according to step S136 of FIG. 3, sealing glass GS is applied between the metal film 123 and the adhesive 124 by screen-printing. The screen is, for example, a fabric made of nylon, Tetoron™, or stainless steel. More specifically, a pattern defining the locations of the applied sealing glass GS is defined on the surface of the screen using a resist. The screen is used for printing by urging printing ink to flow through respective permeable areas on the screen.

Third Embodiment of Quartz Crystal Vibrating Device

FIGS. 8A-8B are elevational sections of this embodiment 100C. FIG. 8A is an elevational section of the vibrating device 100C before the package lid 11C and the package base 12C have been bonded together, and FIG. 8B is an elevational section of the device after the package lid 11C and package base 12C have been bonded together. In this embodiment, components that are similar to corresponding components in the first embodiment have the same respective reference numerals.

This embodiment 100C comprises a package lid 11C, a package base 12C, and a quartz-crystal vibrating piece 10 mounted in the base recess 121 of the package base 12C. The package lid 11C comprises a lid body 110C fabricated of a piezoelectric material or of glass. The lid body 110C defines a central lid recess 111 surrounded by a stepped region 312 surrounding the lid recess 111. The stepped region 312 has a width WI. The stepped region 312 includes a first lid protruding portion 312a adjacent and surrounding the lid recess 111 and a second lid protruding portion 312b situated outboard of the first lid protruding portion 312. The second lid protruding portion has less elevation than the first lid protruding portion 312a. The first lid protruding portion 312a includes an inner peripheral surface M11, and the second lid protruding portion 312b includes an outer peripheral surface M12. The outer peripheral surface M12 extends to the outer edge of the lid protruding portion 312. The outer peripheral surface M12 is actually a recess relative to the inner end face M11.

A band of metal film 113 of width WI/2 width is situated on the inner peripheral surface M11. A band of adhesive 114, having width WI/2, is disposed on the outer end face M12 of the second lid protruding portion 312b.

The package base 12C comprises a base body 120C fabricated of a piezoelectric material or of glass. The base body 120C defines a base recess 121 surrounded by a stepped region 322. The stepped region 322 has a width WI. The stepped region 322 includes a first base protruding portion 322a adjacent and surrounding the base recess 121 and a second base protruding portion 322b situated outboard of the first base protruding portion 322. The second base protruding portion 322b has less elevation than the first base protruding portion 322a. The first base protruding portion 322a includes an inner peripheral surface M21, and the second base protruding portion 322b includes an outer peripheral surface M22. The outer peripheral surface M22 extends to the outer edge of the base protruding portion 322. The outer peripheral surface M22 is actually a recess relative to the inner peripheral surface M21.

A band of metal film 123, having a width of WI/2, is disposed on the inner peripheral surface M21. A band of adhesive 124, having a width of WI/2, is applied to the peripheral surface M22 of the second lid protruding portion 322b. The respective materials of which the metal film 123 and adhesive 124 are made are the same as used in the first embodiment.

Whenever the package lid 11C and package base 12C are heated to within the range of 300° C. to 400° C. and compressed in a nitrogen-gas or vacuum environment, the package lid 11C and package base 12C become bonded together by the adhesives 114 and 124 (FIG. 8B). Meanwhile, the lid recess 111 and base recess 121 collectively define a cavity CT in which the quartz-crystal vibrating piece 10 is mounted. The resulting hermetic seal keeps the cavity CT filled with nitrogen gas or evacuated.

Although the respective gold layers of the metal films 113 and 123 do not melt when heated at 300° C. to 400° C., the bands of these metals contact each other during compression without forming any gaps between them. Even if the surfaces of the gold layers are uneven at time of compression, they nevertheless contact each other and even out without any gaps due to the softness of gold compared to other metals. Also, compression does not damage the gold layers as a result of the high ductility of gold. By avoiding gap formation between the co-compressing gold layers, gas is prevented from entering the cavity CT as the adhesive 124 is being heated. This allows the piezoelectric vibrating piece 10 inside the cavity CT to vibrate more accurately.

Although, in this embodiment, although the recess surfaces 115, 125 are formed on both the lid 11C and base 12C, these features may alternatively be formed on only one or the other of the lid 11C and base 12C. For example, the adhesive can be applied to either the lid 11C or the base 11C, depending upon which of these components defines a recess. Furthermore, although the metal films 113, 123 are formed on both the lid 11C and the base 12C of this embodiment, the metal films alternatively can be formed on only one or the other.

A method for manufacturing this embodiment of crystal vibrating device differs from the respective method for forming the package lid and base differs any of the manufacturing methods disclosed in the first embodiment. Nevertheless, steps T12 and T13 correspond to steps S12 and S13 in FIG. 3, as follows.

Figure 9:
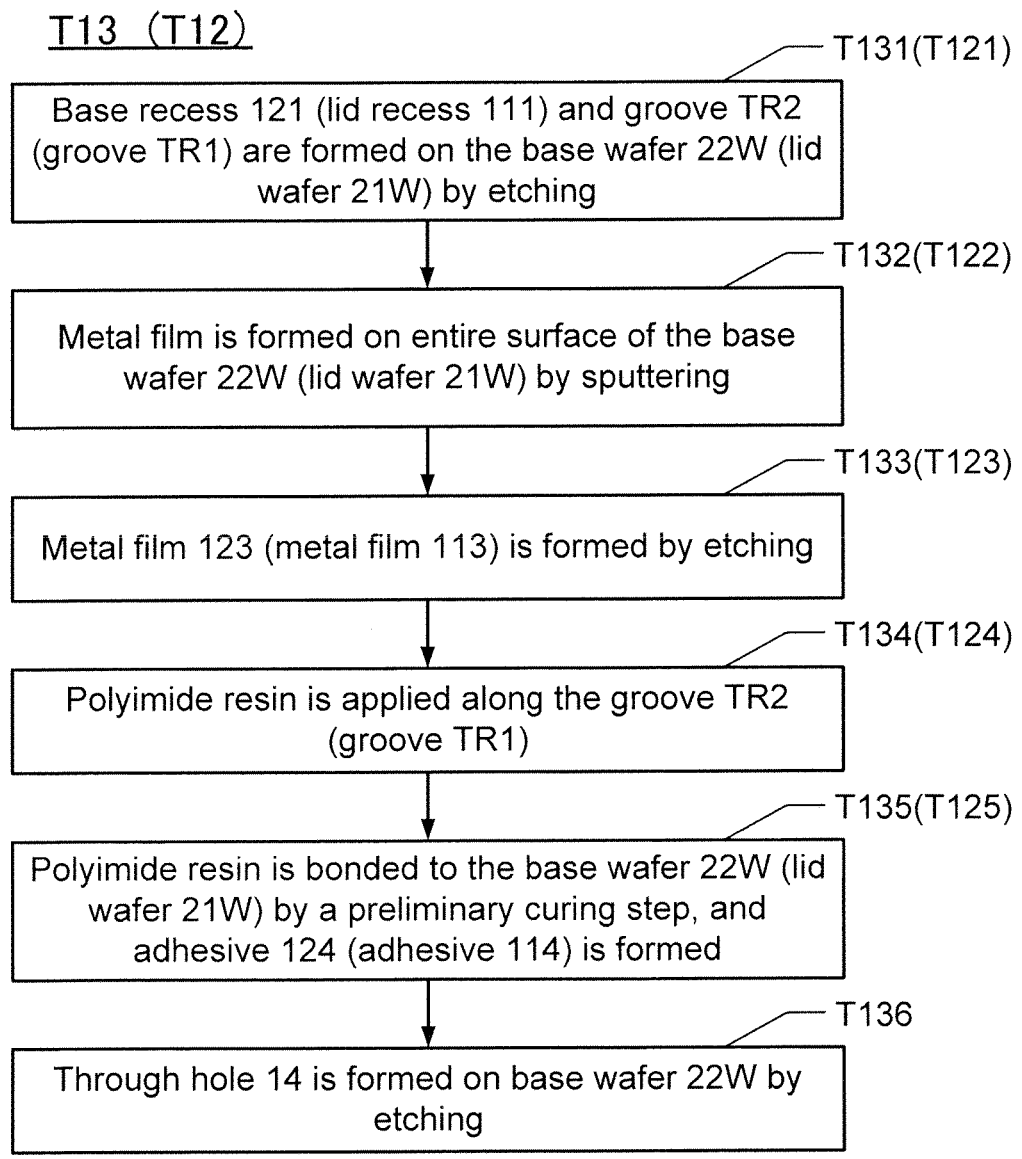
FIG. 9 is a flow-chart of steps of an embodiment of a method including steps for manufacturing package lids and steps for manufacturing package bases used in the third embodiment.

FIG. 9 is a flow-chart of an embodiment of a manufacturing protocol for producing (T12) package lids 11C or producing (T13) package bases 12C as used in this embodiment of a vibrating device. The protocols T12 and T13 in FIG. 9 are similar to each other except for the formation of through-holes 14 on the package base in step T136 (T13). Hence, the manufacturing protocols T12 and T13 have essentially the same steps except the last step. The protocol T12 for forming package lids 11C comprises steps T121-T125, and the protocol T13 for forming package bases 12C comprises steps T131-T136. The following description is of the protocol T13 for forming package bases 12C.

FIG. 10 is a plan view of a base wafer 22W according to the third embodiment. The lid wafer 21W differs from the base wafer 22W in that the through-holes 14 are absent in the lid wafer 21W, as indicated by the dotted-line circles.

In step T131 several hundreds to several thousands of bases 120C are formed on the base wafer 22W. The base wafer is a circular, uniformly planar plate of quartz-crystal material. Each base defines a respective base recess 121. Between each pair of adjacent base recesses 121 is a groove TR2 of width W. The grooves TR2 are recessed below the plane of the base wafer 22W, and extend in the X'-axis and Z'-axis directions.

Each stepped region 125 shown in FIG. 8 has a width of half the width of the groove TR2 (i.e., the stepped region 125 has a width W/2). On lid wafers 21W, a groove TR1 forms the stepped region 115 shown in FIG. 8. These grooves are formed by a method similar to the method described in step S121 for forming lid recesses 111 in the first embodiment.

In step T132, a foundation layer of chromium (Cr) is formed over the entire base wafer 22W, followed by formation of an overlying layer of gold (Au). These metal layers are formed by sputtering or vacuum-deposition.

In step T133 a band of metal film 123 is formed on the inner peripheral surfaces M21 by photolithographic exposure and etching.

In step T134, a low-viscosity liquid polyimide resin is applied in the grooves TR2 and allowed to flow along the grooves TR2. This resin is destined to become the adhesive.

In step T135, the resulting bands of polyimide resin are bonded to the base wafer 22W by a preliminary curing step conducted at a temperature of about 250° C., which is sufficient to produce an approximately 75% cure of the resin.

In step T136, through-holes 14 are formed in defined locations on the base wafer 22W. In this embodiment, although forming the through-holes is a final step in the protocol, the through-holes can be formed simultaneously with the formation of the base recesses 121.

In this embodiment, since the adhesives 114, 124 are applied only on the recess surfaces 115, 125 in accordance with FIG. 9, the amount of polyimide resin is substantially reduced compared to the amount consumed in the first and second embodiments.

Alternative to Third Embodiment

FIG. 11 is an elevational section of an alternative configuration of the third embodiment of a quartz-crystal vibrating device 100C' after bonding together the package lid 11C and the package base 12C. In this alternative configuration, components that are similar to corresponding components in the third embodiment have the same respective reference numerals.

In FIG. 8 the adhesive 114 is applied to the side surfaces M13 of the recesses 115, and the adhesive 124 is applied to the side surfaces M23 of the recesses 124. In FIG. 11, in contrast, the vibrating device 100C' defines a gap SP1 between the adhesive 114, 124 and respective side surface M13, M23. The gap prevents leakage of adhesive 114, 124 into the package lid 11C and package base 12C when they are being bonded together.

The vibrating device 100C' is manufactured by a series of protocols and steps that are nearly identical to the method for manufacturing vibrating devices 100C according to the third embodiment. The method for manufacturing the vibrating devices 100C' differs in that, after the polyimide resin is bonded to the base wafer 22W (and to the lid wafer 21W) according to step T135 shown in FIG. 9, the polyimide resin on both sides of the groove TR2 (and groove TR1) indicated in FIG. 10, is exposed. After bonding together the lid wafer 11W and base wafer 12W, a gap SP1 is rimmed between the bonded adhesive 114, 124 and respective side surfaces M13, M23.

Fourth Embodiment of Quartz-Crystal Vibrating Device

FIGS. 12A and 12B are respective elevational sections of a quartz-crystal vibrating device 100D according to this embodiment. FIG. 12A is an elevational section of the device 100D before bonding the package lid 11D and package base 12D together, and FIG. 12B is an elevational section of the device after bonding together the package lid 11D and package base 12D. In this embodiment, components that are similar to corresponding components in the first embodiment have the same respective reference numerals.

This embodiment of a vibrating device 100D comprises a package lid 11D, a package base 12D, and a quartz-crystal vibrating piece 10 mounted in the base recess 121. The package lid 11D comprises a lid body 110D fabricated of a piezoelectric material or of glass. The lid 110D defines a lid recess 111 and a lid protruding portion 412 extending around the periphery of the lid recess 111. The lid protruding portion 412 has a width WI. Each lid protruding portion 412 includes a respective thin, long gap 116 extending approximately along the centerline of the lid protruding portion 412. The gaps 116 represent respective recesses in the peripheral surfaces of the lid protruding portions 412. The gaps 116 divide the peripheral surface of each lid protruding portion 412 into a respective inner end face M31 and a respective outer end face M32.

A band of metal film 113, having a width less than WI/2, is formed on the inner end face M31, and a band of adhesive 114, having a width of less than WI/2, is formed on the inner end face M32 of the lid protruding portion 412.

The package base 12D comprises a base body 120D fabricated of a piezoelectric material or of glass. The base 120D defines a base recess 121, a base protruding portion 422, and a base recess surrounding the base recess 121. The base protruding portion has a width WI. Each base recess 422 defines a respective thin, long gap 126 extending approximately along the centerline of the base protruding portion. The gaps 126 represented respective recesses in the peripheral surfaces of the base protruding portions 422. The gaps 126 divide the peripheral surface of each lid protruding portion 422 into a respective inner end face M41 and a respective outer end face M42.

A band of metal film 123, having a width less than WI/2, is formed on the inner end face M41, and a band of adhesive 124, having a width of less than WI/2, is formed on the outer end face M42.

The package lid 11D and package base 12D are bonded together when the adhesive bands 114, 124 are heated to within a range of 300° C. to 400° C. accompanied by compression of the package lid 11D and package base 12D together (FIG. 12B). During such bonding of the package lid 11D and package base 12D, excess adhesive 114, 124 tends to flow into the gaps 116, 126. In addition, the respective layers of gold of the metal films 113, 123 contact each other without any gaps therebetween. Thus, excess adhesive 114, 124 does not flow onto the metal films 113, 123. The gaps 116, 126 prevent gas, liberated from the adhesives 114, 124, from entering the cavities CT during the heating step.

In this fourth embodiment, the gaps 116, 126 are described as being formed on both the package lid 11D and package base 12D, respectively. Alternatively, a gap can be formed on the package lid 11D or the package base 12D.

The method for manufacturing the package lid 11D differs from the method described in the first embodiment in that, in the fourth embodiment, the package lid 11D and the gap 116 are formed simultaneously, and the package base 12D and the base recess 121 are formed simultaneously. Other steps in the method of forming the piezoelectric vibrating piece are as described in the first embodiment.

Fifth Embodiment of Quartz-Crystal Vibrating Device

FIGS. 13A and 13B are respective elevational sections of a quartz-crystal vibrating device 100E according to this embodiment. FIG. 13A is an elevational section of the vibrating device 100E before bonding together the package lid 11E and the package base 12E. FIG. 13B is an elevational section after bonding the package lid 11E and the package base 12E together.

The vibrating device 100E comprises a package lid 11E, a package base 12E, and a quartz-crystal vibrating piece 10 mounted inside the base recess 121 of the package base 12E. Note that no bands of metal film 123 or adhesive 124 are formed on the package base 12E.

The package lid 11E comprises a lid body 110A. A band of adhesive 114 is formed on the entire first peripheral surface M1 of the lid protruding portion 112. The band of adhesive has a width WI. The thickness of the adhesive is in the range of 5 to 15 μm. A metal film 113 is formed partially over the band of adhesive 114 and into the lid recess 111. The metal film 113 includes a horizontal portion 113a extending in the Z'-axis direction and a vertical portion 113b contiguous with the horizontal portion 113a and extending over the peripheral surface Ms of the lid recess 111. The vertical portion of the metal film 113b extends to the bottom surface of the lid recess 111.

The package lid 11E and package base 12E are bonded together when the adhesive 114 is heated to within the range of 300° C. to 400° C. accompanied by compression of the package lid 11E and package base 12E together. As a result of this bonding, the lid recess 111 and base recess 121 become connected together, forming a cavity CT enclosing the quartz-crystal vibrating piece 10. The compression also causes the gold layer on the metal-film portion 113a to contact the second peripheral surface M2 on the base 120. Due to the soft ductile nature of the gold layer as pressed onto the metal-film portion 113a, the gold contacts the second end face M2 evenly, regardless of any initial unevenness in its surface. The vertical portion of the metal film 113b prevents gas, liberated from the adhesive during heating, from entering the cavity CT during bonding of the package lid 11E and package base 12E together.

In this embodiment, although the bands of adhesive 114 and metal film 113 are formed on the first peripheral surface M1 of the package lid 11E, they alternatively can be formed on the second peripheral surface M2 of the package base 12E, or on both M1 and M2.

In an embodiment of a method for manufacturing this vibrating device 100E, the protocol S12 for forming the package lid and the protocol S13 for forming the package base are different from corresponding protocols in the method for manufacturing vibrating devices according to the first embodiment, shown in FIG. 3. In the current embodiment, the protocol for forming the package base 12E is performed according to the step S131 in FIG. 3. Hence, the protocol P12, which corresponds to protocol S12 in FIG. 3, is described below.

Figure 14:
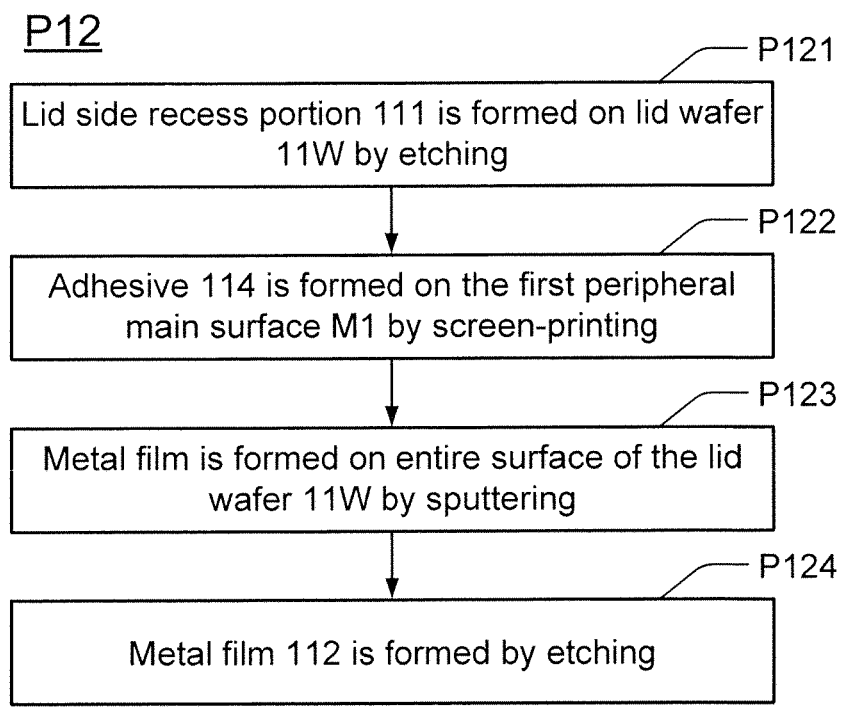
FIG. 14 is a flow-chart of step P12 of a representative method for manufacturing package lids used in the fifth embodiment.

FIG. 14 is a flow-chart of a protocol for manufacturing package lids 11E. In step P121, as shown in FIG. 4, several hundreds to several thousands of lids 110E are formed on the lid wafer 11W, which is a circular, uniformly planar plate of quartz-crystal material. If the material of the lid wafer 11W is quartz-crystal or glass, the lid recess 111 is formed substantially in the center of the lid 110 by etching or mechanical processing. Thus, the lid recesses 111 and first peripheral surfaces M1 are formed on the lid wafer 11W.

In step P122, an adhesive 114 is applied to the first peripheral surface M1 of the lid wafer 11W by screen-printing. The screen is, for example, a fabric made of nylon, Tetoron™, or stainless steel.

In step P123, a foundation layer of chromium (Cr) is formed on the entire surface of the lid wafer 11W, followed by formation of an overlying layer of gold (Au) on the entire surface. These metal layers are applied by sputtering or vacuum-deposition. During this step, the layer of chromium and layer of gold are formed on the surface of the adhesive 114 as well.

In step P124, after performing photolithography and etching, unprotected areas of the metal film are removed. Left behind are the parallel metal film 113a, formed on the first peripheral surface M1 and surrounding the lid recess 111, as well as the vertical metal film 113b on the side walls of the lid recess 111.

Sixth Embodiment of Quartz-Crystal Vibrating Device

FIGS. 15A and 15B are respective elevational sections of a quartz-crystal vibrating device 100F of this embodiment. FIG. 15A is an elevational section of the vibrating device 100F before bonding the package lid 11E and package base 12F together. FIG. 15B is an elevational section of the vibrating device 100F after bonding the package lid 11E and the package base 12F together.

This sixth embodiment 100F includes a package lid 11E, a package base 12F, and a quartz-crystal vibrating piece 10 mounted in the base recess 121 of the package base 12F. The package base 12F includes a metal film 123 comprising a foundation layer of chromium (Cr) on the second peripheral surface M2, and an overlying layer of gold (Au). The metal film 123 surrounds the base recess 121. Other features of this package base 12E are as described regarding the package base 12E of the fifth embodiment.

The package lid 11E and package base 12F are bonded together by aligning the package lid 11E and package base 12E, heating to a temperature within the range of 300° C. to 400° C., and simultaneously compressing together the package lid 11E and the package base 12F (FIG. 15B). The lid recess 111 and the base recess 121 are bonded together by the adhesive 114, which effectively forms a cavity CT in which the vibrating piece 10 is mounted. In addition, during compression respective gold layers of the metal films 113 and 123 come into contact with each other without forming intervening gaps, which prevents gas, produced by heating the adhesive 124, from entering the cavity CT.

This embodiment of a quartz-crystal vibrating device 100F can be manufactured by a process as summarized in FIG. 3, except that the package lid 11E is manufactured according to steps P121-P124 on the flow-chart shown in FIG. 14. The package base 12F can be manufactured by according to steps S131 to S133 summarized in the flow-chart shown in FIG. 3.

Seventh Embodiment of a Quartz-Crystal Vibrating Device

FIGS. 16A-16B are respective elevational sections of this embodiment. FIG. 16A shows the device 100G after aligning the package lid 11G and package base 12E but before bonding. FIG. 15B shows the result of bonding the package lids 11G to corresponding package bases.

In FIGS. 16A-16B, the vibrating device 100G includes a package lid 11G, a package base 12E (according to the fifth embodiment), and a quartz-crystal vibrating piece 10 mounted inside the base recess 121 defined by the package base 12E.

The adhesive 114 on the package lid 11G includes an outboard band of adhesive 114a formed on the first peripheral surface M1 around the lid recess 111. An inboard band of adhesive 114b is also formed on the first peripheral surface M1. Both bands 114a, 114b extend around the lid recess 111. The inboard band of adhesive 114b has a surficial metal film 113a extending in the Z'-axis direction, as explained in the fifth embodiment. A vertical metal film 113b is integral to metal film 113a and bonded to the peripheral surface Ms of the lid recess 111. An outer band of adhesive 114a is separate from the band of the inner adhesive 114b, and applied with a predetermined gap SP2, so that it does not contact the metal film 113.

The package lid 11G and the package base 12E are aligned and bonded together by heating the adhesive to a temperature within the range of 300° C. to 400° C. while simultaneously compressing the package lid 11G and package base 12E together (FIG. 16B). The lid recess 111 and base recess 121 are thus bonded together by the adhesive 114 and form a cavity CT in which the quartz-crystal vibrating piece 10 is mounted. Compression also causes the gold layer of the metal film 113a to contact the second peripheral surface M2 of the base 120A without any gaps therebetween. Due to the soft, ductile nature of gold in this film 113a, the gold layer contacts the second peripheral surface M2 even when the contacting surfaces are uneven.

During compression the inner band of adhesive 114b is urged to flow into the gap SP2 between the outer band of adhesive 114a and the inner band of adhesive 114b. This flow remains intact even as the package lid 11G and package base 12E are bonded together. This flow prevents the metal band 113b from being pressed into the lid recess 111 by the inner adhesive 114b, and protects the peripheral surface Ms of the lid recess 111.

In an embodiment of a method for manufacturing a quartz-crystal vibrating device 100G according to this embodiment, step P122 (manufacturing the package lid 11E, indicated in FIG. 14) involves different action than the corresponding step in the method for manufacturing the fifth embodiment. In a method for manufacturing this seventh embodiment, an inner band of adhesive 114a and an outer band of adhesive 114b are formed, instead of one band of adhesive 114.

Alternative to Seventh Embodiment

FIG. 17 is an elevational section of an alternative configuration of the quartz-crystal vibrating device 100G'. FIG. 17A is an elevational section of the vibrating device 100G' before bonding together the package lid 11G and package base 12E. FIG. 17B shows the situation after bonding together the package lid 11G and the package base 12E.

In FIG. 17A the vibrating device 100G' is formed so that the metal film 113a' covers only a part of the adhesive 114b in the cavity CT. According to this configuration, whenever the package lid 11G and the package base 12E are being bonded together as shown in FIG. 17B, the package lid 11G and the package base 12E can be bonded not only by adhesive 114a formed outside, but also by adhesive 114b formed inside the cavity CT. This configuration increases the adhesiveness of the package lid 11G and the package base 12G and increases airtightness inside the cavity CT.

Eighth Embodiment of Quartz-Crystal Vibrating Device

Figure 18:
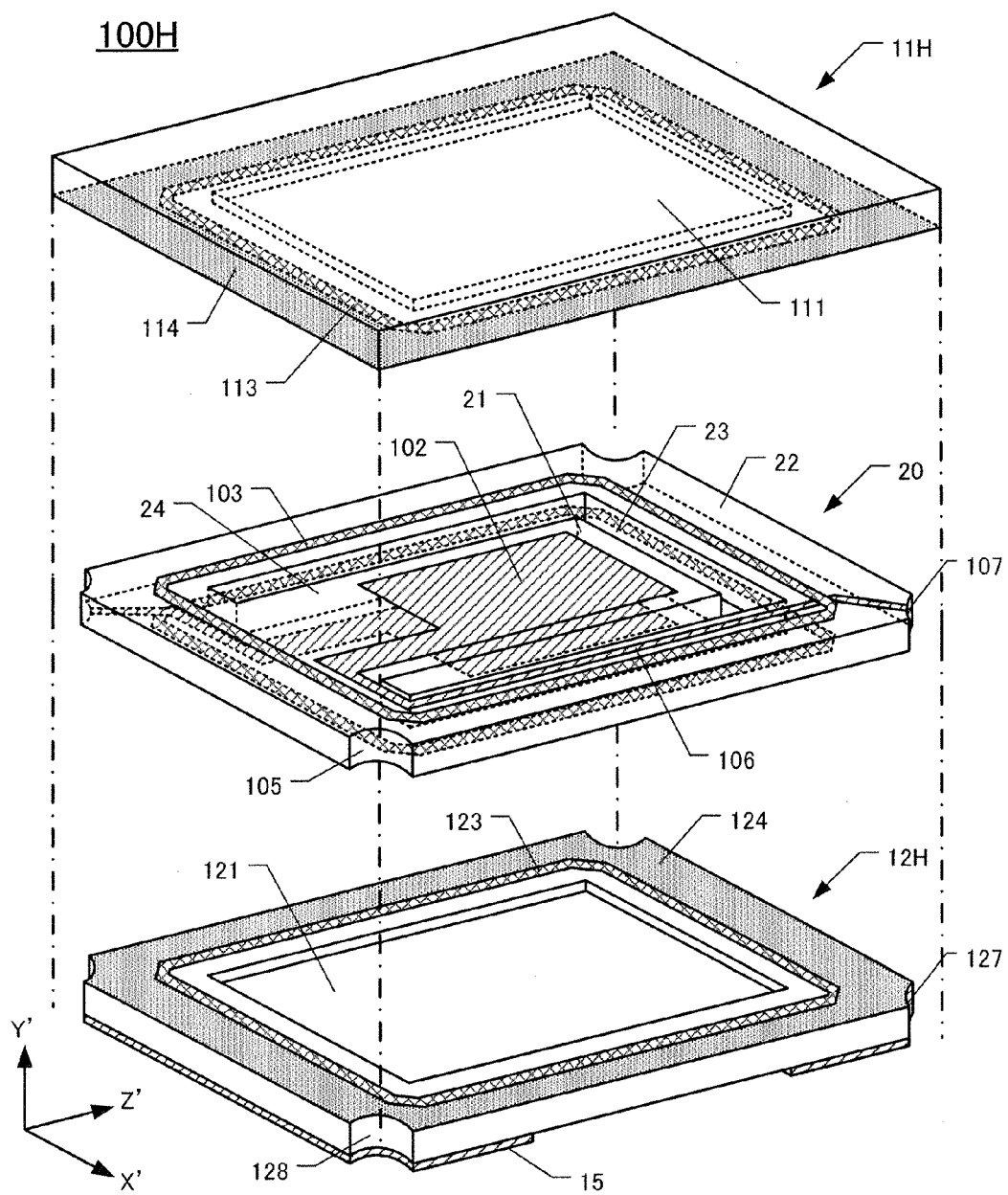
FIG. 18 is an exploded perspective view of an eighth embodiment of a quartz-crystal vibrating device.

FIG. 18 is an exploded perspective view of this embodiment 100H. FIG. 19A is an elevational section of this embodiment before bonding the package lid 11H, quartz-crystal frame 20, and the package base 12H together. FIG. 19B is an elevational section obtained after bonding together the package lid 11H, quartz-crystal frame 20, and the package base 12H.

As shown in FIG. 18 this embodiment 100H includes the package lid 11H on top, the package base 12H on the bottom, and a quartz-crystal frame 20 sandwiched therebetween. The package lid 11H defines a lid recess 111 on its downward-facing main surface, and defines a base recess 121 on the upward-facing main surface. The recesses 11, 21 face each other across the quartz-crystal frame 20. As the package lid 11H and package base 12H are being bonded together (in a nitrogen atmosphere or under a vacuum) to respective main surfaces of the quartz-crystal frame 20, cavities CT are formed on the lid recess 111. The base recess 121 is filled with nitrogen gas or kept in vacuum in an airtight manner.

The package lid 11H comprises a lid body 110H fabricated of a piezoelectric material or glass. The lid 110H defines a lid recess 111 and a lid protruding portion 112. The lid protruding portion 112 has a first peripheral surface M1 of width WI on the outer periphery of the lid recess 111. On the first peripheral surface M1 of the lid protruding portion 112, a band of adhesive 114 is formed so as to surround the lid recess 111. On the band of adhesive 114 thus formed around the lid recess 111, a first metal film 113 is formed so as to extend over the inner edge of the band of adhesive and extend toward the inner edge of the lid recess 111. Thus, the metal film 113 on the first peripheral surface M1 of the lid protruding portion 112 covers an inboard part of the band of adhesive 114.

The package base 12H comprises a base body 120H fabricated by piezoelectric material or glass. The base body 120H defines a base recess 121 and a base protruding portion 122, having a second peripheral surface M2 of width WI, extending around the periphery of the base recess 121. On the second peripheral surface M2 of the base protruding portion 122, a band of adhesive 124 is formed so as to surround the base recess 121. On the band of adhesive 124 thus formed around the base recess 121, a metal film 123 is formed so as to extend over the inner edge of the band of adhesive and extend toward the inner edge of the base recess 121. Thus, the metal film 123 on the second peripheral surface M2 of the base protruding portion 122 covers an inboard part of the band of adhesive.

External electrodes 15 are formed on the lower main surface (mounting surface) of the base 120H. Also, a quarter-round cutout 128 (FIG. 22) is situated on each edge corner of the base body 120H. On two diametrically opposed cutouts 128, respective connection electrodes 127 are formed in a way that also achieves electrical connection of the external electrodes 15 with respective excitation electrodes 102 of the quartz-crystal frame 20.

The quartz-crystal frame 20 is formed of AT-cut quartz-crystal material and has a front surface Me on the package lid 11H and a back surface Mi on the package base 12H. The quartz-crystal frame 20 includes a quartz-crystal vibrating portion 21 and a frame portion 22 surrounding the vibrating portion 21. On the upward-facing main surface Me of the frame portion 22, a band of metal film 103 is situated so as to be aligned with corresponding locations on the metal film 113 on the package lid 11H and surround the quartz-crystal vibrating portion 21. Similarly, on the downward-facing main surface Mi of the frame portion 22, a band of metal film 103 is situated so as to be aligned with corresponding locations on the metal film 123 on the package base 12H and surround the quartz-crystal vibrating portion 21.

Between the quartz-crystal vibrating portion 21 and the frame portion 22 is a U-shaped void 23 that extends completely through the thickness of the frame portion. The void 23 is not present at a connecting portion 24 by which the quartz-crystal vibrating portion 21 is connected to the frame portion 22. A respective excitation electrode 102 is situated on the upper main surface Me and lower main surface Mi of the vibrating portion 21. A respective extraction electrode 106 is formed on each main surface of the frame portion 22. The extraction electrodes are electrically conducted to respective excitation electrodes 102. On each corner of the quartz-crystal frame 10 is a quarter-round cutout 105 that is a respective portion of a through-hole CH formed previously (see FIG. 21). On the inner surface of each of two diametrically opposed quarter-rounds 105 is a respective connection electrode 107 that connects to the respective quarter-round 128 on the package base 12H and to the respective extraction electrode 106 on the quartz-crystal frame 20.

Whenever an alternating electrical voltage (i.e., a potential that regularly alternates positives and negative voltage) is applied to this device, the excitation electrodes 102 are energized and induced to vibrate in a thickness-shear vibration mode, and oscillate at predetermined frequency. Although this embodiment includes the void 23, it will be understood that the gap 23 is not necessary. Furthermore, the quartz-crystal vibrating portion 21 can be either mesa-type or inverted mesa-type.

The metal films 103, 113, 123 of this embodiment all comprise a gold (Au) layer having a thickness in the range of 2000 Å to 3000 Å formed over a layer of chromium (Cr) having a thickness in the range of 50 Å to 700 Å.

The package lid 11H, package base 12H, and quartz-crystal frame 20 are bonded together when aligned and compressed as the adhesive 124 is heated in a range of 300° C. to 400° C. Due to the soft, ductile nature of gold (Au) compared to other metals, the surfaces that are compressed together "even out" and contact each other without intervening gaps. Also, the ductile gold layers do not become damaged during heating and compression.

The quartz-crystal frame 20 is formed of quartz-crystal material. The package lid 11H and package base 12H can be formed of glass. In this instance, use of a polyimide resin as the adhesive can effectively prevent changes in vibration frequency caused by differences in the thermal expansion coefficients of these materials. This adhesive material, having relatively low hardness, also reduces damage to the quartz-crystal vibrating device that otherwise may occur during manufacture.

Figure 20:
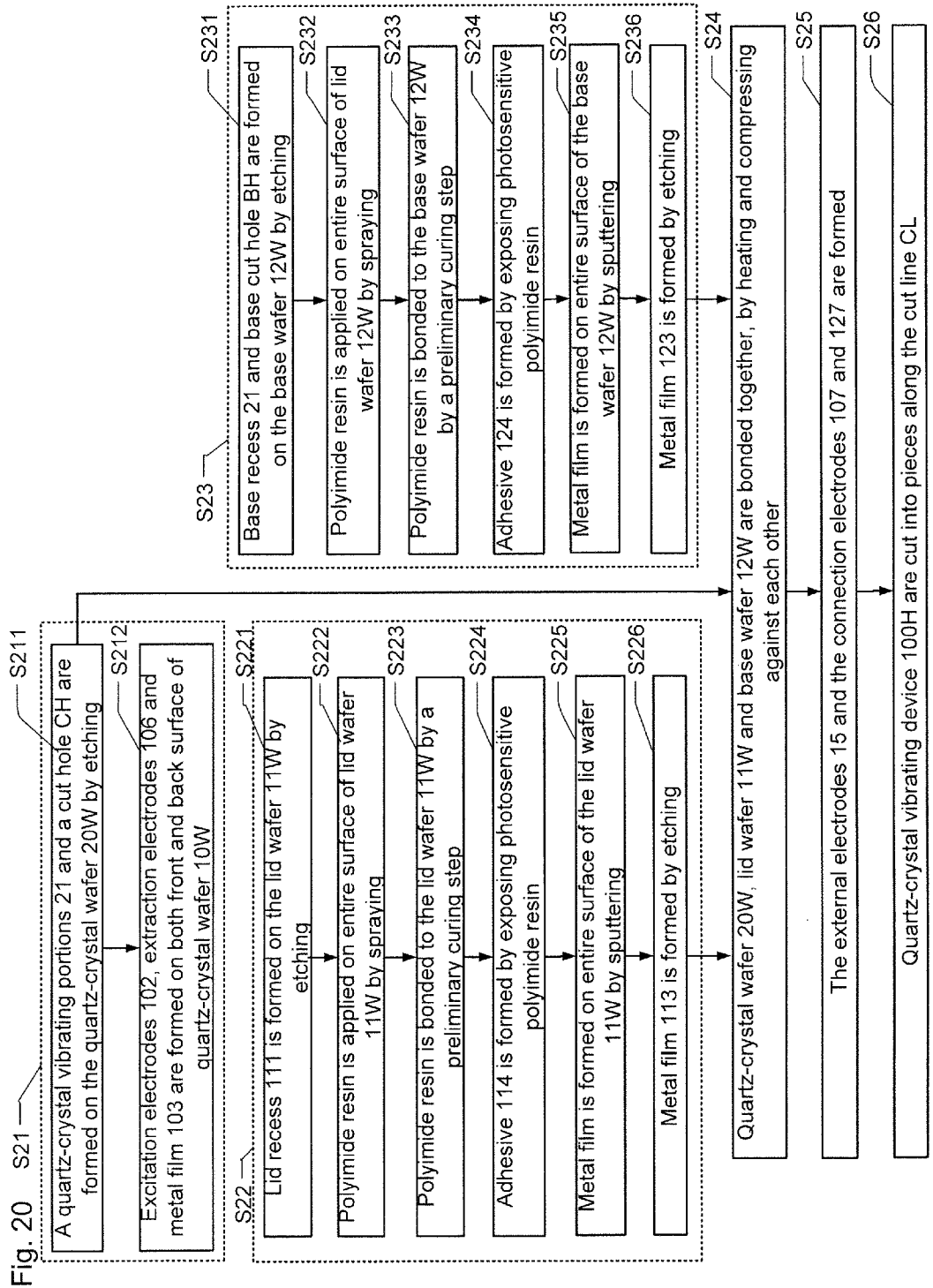
FIG. 20 is a flow-chart of steps in an embodiment of a method for manufacturing the eighth embodiment of a quartz-crystal vibrating device.
Figure 21:
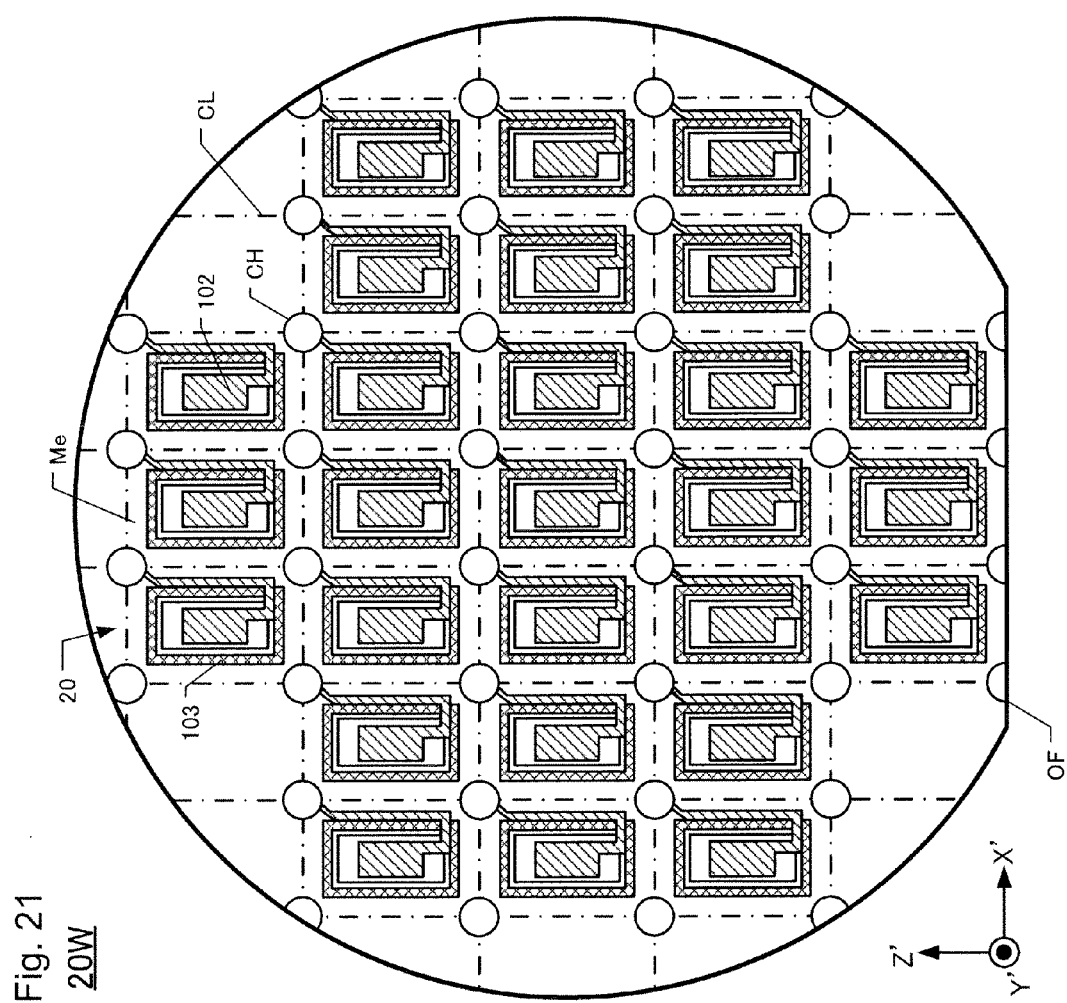
FIG. 21 is a plan view of a quartz-crystal wafer as used in the method for manufacturing the eighth embodiment of a quartz-crystal vibrating device.
Figure 22:
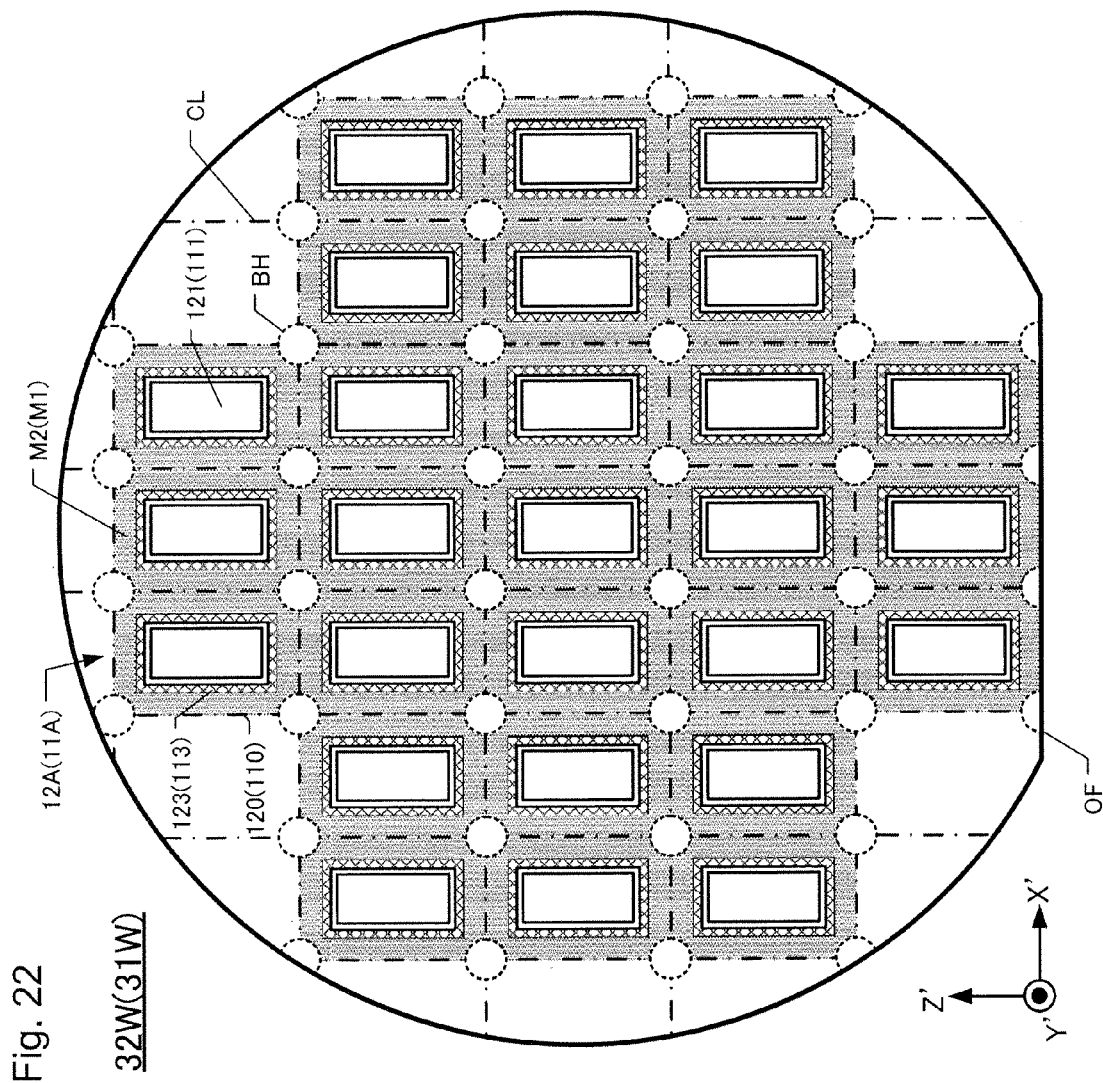
FIG. 22 is a plan view of a lid wafer or base wafer as used in the method for manufacturing the eighth embodiment of a quartz-crystal vibrating device.

FIG. 20 is a flow-chart of steps for manufacturing this embodiment of a quartz-crystal vibrating device 100H. In FIG. 20, protocol S21 for manufacturing the quartz-crystal frame 20, protocol S22 for manufacturing the package lid 11H, and protocol S23 for manufacturing the package base 12H can be conducted in series or in parallel. FIG. 21 is a plan view of a quartz-crystal wafer 20W used in the method, FIG. 22 is a plan view of a base wafer 32W used in the method. The lid wafer 31W is different from the base wafer 32W by lacking the through-holes BH present in the base wafer 32W. For this reason, the through-holes BH in FIG. 22 are drawn as dotted lines.

In protocol S21 of FIG. 20, quartz-crystal frames 20 are manufactured. Protocol S21 includes steps S211 and S212. In step S211, as shown in FIG. 21, multiple quartz-crystal vibrating portions 21 and through-holes CH are formed on the quartz-crystal wafer 20W, which is a circular, uniformly planar plate of quartz-crystal material. The quartz-crystal vibrating portions 21 and through-holes CH are formed by etching or mechanical processing. In step S212, a foundation layer of chromium (Cr) is formed on the entire upper and lower main surfaces Me, Mi, respectively, of the quartz-crystal wafer 20W, followed by formation of an overlying layer of gold (Au) on both main surfaces by sputtering or vacuum-deposition. Then, using a photolithography and etching process as in protocol S11 of the method for manufacturing the first embodiment, the excitation electrodes 102, extraction electrodes 106, and metal bands 103 are formed on both main surfaces Me, Mi, as shown in FIG. 21.

In protocol S22, package lids 11H are manufactured. Protocol S22 includes steps S221 to S226. In step S221, as shown in FIG. 22, multiple lid recesses 111 are formed on the lid wafer 31W, which is a circular, uniformly planar plate of quartz-crystal material. The base recesses 121 are formed by etching or mechanical processing. In step S222, a polyimide resin (destined to be the adhesive) is applied on the entire main surface of the lid wafer 31W by spraying. In step S223, the applied polyimide resin is bonded to the base wafer 31W by a preliminary curing step performed at a temperature of about 250° C., which is sufficient to produce an approximately 75% cure of the adhesive. In step S224, as shown in FIG. 22, polyimide resin (destined to be the adhesive 114) is applied only on the first peripheral surface M1 of the lid wafer 31W by exposure of photosensitive polyimide resin. In step S225, a foundation layer of chromium (Cr) is formed on the entire main surface of the lid wafer 31W, followed by formation of an overlying layer of gold (Au) on the entire main surface, by sputtering or vacuum-deposition. In step S226, using photolithography and etching, the bands of metal film 113 are formed inboard of the adhesive 114 on the lid wafer 31W, as shown in FIG. 22.

In protocol S23, package bases 12H are manufactured. Protocol S23 includes steps S231 to S236. In step S231, as shown in FIG. 22, multiple base recesses 121 and through-holes BH are formed on the base wafer 32W, which is a circular, uniformly planar plate of quartz-crystal material. The base recesses 121 and through-holes BH are formed by etching or mechanical processing. In step S232, polyimide resin (destined to be the adhesive) is applied to the entire main surface of the base wafer 32W by spraying. In step S233, the polyimide resin is bonded to the base wafer 32W by a preliminary curing step conducted at a temperature of about 250° C., which is sufficient to produce an approximately 75% cure of the adhesive. In step S234, as shown in FIG. 22, polyimide resin (destined to be the adhesive 114) is applied only on the second peripheral surface M2 of the base wafer 32W, by exposure of photosensitive polyimide resin. In step S235, a foundation layer of chromium (Cr) is formed on the entire main surface of the base wafer 32W, followed by formation of an overlying layer of gold (Au) on the entire main surface by sputtering or vacuum-deposition. In step S236, using photolithography and etching, the bands of metal film 123 are formed inboard of the adhesive 124 on the base wafer 32W, as shown in FIG. 22.

In protocol S24, the lid wafer 31W and quartz-crystal wafer 20W are bonded together by co-aligning them, heating the adhesive 114, and compressing them together. The quartz-crystal wafer 20W and the base wafer 32W are bonded together by co-aligning them, heating the adhesive 124, and compressing them together. To facilitate co-alignment, each wafer 31W, 32W, 20W includes a respective orientation flat OF, as shown in FIGS. 21 and 22, formed on an outer edge of each wafer. The orientation flats OF also provide a reference identifying the direction of the crystal lattice. Using the orientation flats OF as alignment references, the lid wafer 31W, the quartz-crystal wafer 20W, and the base wafer 32W are co-aligned when stacked, allowing accurate bonding. For bonding, the wafers are heated and compressed at a temperature in the range of 300° C. to 400° C.

As shown in FIG. 19B, the gold layer of the metal film 113 on the first peripheral surface M1 of the package lid 11H and the gold layer of the metal film 103 on the surface Me of the quartz-crystal wafer 20W contact each other during compression without forming intervening gaps. Similarly, the gold layer of the metal film 103 on the lower main surface Mi of the quartz-crystal wafer 20W and the gold layer of the metal film 123 on the second peripheral surfaces M2 of the package bases 12H contact each other during compression without forming intervening gaps. Hence, the metal films 103, 113, 123 prevent gas from entering the cavity CT while the adhesive bands 114, 124 are being heated to a temperature in the range of 300° C. to 400° C. Consequently, the piezoelectric vibrating portion 21 mounted in the cavity CT vibrates at a more accurate frequency.

In step S25 external electrodes 15 are formed on the lower main surface (mounting surface) of the base wafer 32W. Also, connection electrodes 107, 127 are formed on the inner surfaces of through-holes CH formed in the quartz-crystal wafer 20W and on the inner surfaces of through-holes BH formed in the base wafer 32W, using the technique as used for forming the metal films 113, 123 set forth in protocols S22 and S23.

In step S26, a sandwich consisting of the lid wafer 31W, quartz-crystal wafer 20W, and base wafer 32W bonded together is cut into individual quartz-crystal vibrating devices 100H. Cutting is performed along cut lines CL (denoted by dot-dash lines in FIGS. 21 and 22) using a dicing unit such as a laser beam or a dicing saw. Thus, several hundreds to several thousands of quartz-crystal vibrating devices 100H are produced, each vibrating accurately at a specified vibration frequency when electrically energized.

Ninth Embodiment of Quartz-Crystal Vibrating Device

Figure 23:
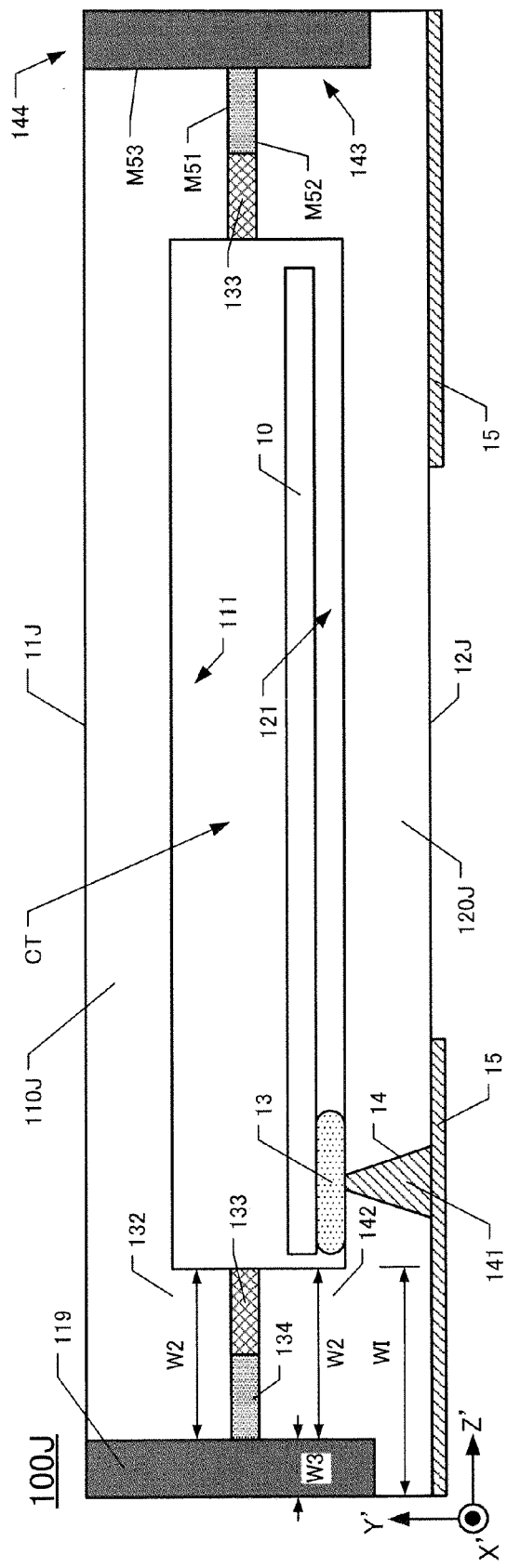
FIG. 23 is an elevational section of a ninth embodiment of a quartz-crystal vibrating device.

FIG. 23 is an elevational section of a quartz-crystal vibrating device 100J according to this embodiment. In this embodiment, components that are similar to corresponding components in the first embodiment have the same respective reference numerals.

The vibrating device 100J comprises a package lid 11J defining a lid recess 111, a package base 12J defining a base recess 121, and a quartz-crystal vibrating piece 10 mounted in the base recess 121.

The package lid 11J comprises a lid body 110J fabricated of a piezoelectric material such as quartz-crystal or glass. The lid body 110J defines a lid recess 111 and a lid protruding portion 132. The lid protruding portion 132 includes a first peripheral surface M51, having a width W2, located peripherally of the lid recess 111.

The package base 12J comprises a base body 120J fabricated of a piezoelectric material or glass. The base body 120J defines a base recess 121 and a base protruding portion 142. The base protruding portion has a second peripheral surface M52, having width W2, located peripherally of the base recess 121. The base body 120J also defines a recess 143, having width W3, that has less elevation than the second peripheral surface M2. The recess 143 extends to the edge of the quartz-crystal vibrating device 100J. The width WI between the base recess 121 and the vibrating device 100J is defined as W1=W2+W3.

A metal film 133, having width (W2/2), is situated between the lid protruding portion 132 and the base protruding portion 142 so as to surround the cavity CT. A band of adhesive 134, having width (W2/2), is situated outside the metal film 133 so as to surrounds the cavity CT. The configuration of the metal film 133 and of the band of adhesive 134 is as described in the first embodiment.

The package lid 11J and package base 12J have a lid protruding portion 132 and base protruding portion 142, respectively, each having width W2. A recess surface 143 is situated outboard of the base protruding portion 142 of the package base 12J. Thus, a notch 144 is formed, when forming the groove TR3 (FIG. 24), around the periphery of the quartz-crystal vibrating device 100J, so as not to cut through from the package lid 11J to the package base 12J.

The package lid 11J extends between opposing edges of the peripheral surface M53 of the notch 144. The notch 144 can be filled with glass 119 that is bonded to the adhesive 134 to form package bases 12J. The glass 119 can be a low-mp glass as described in the alternative to the second embodiment.

Whenever the adhesive 134 is heated to a temperature in the range of 300° C. to 400° C. in a nitrogen gas or vacuum environment while compressing the wafers together, the package lids 11J and respective package bases 12J are bonded together.

The presence of the glass 119 outboard of the adhesive 134 prevents gas from entering the cavity CT. This configuration also prevents the adhesive 134 from being exposed to the atmosphere, thereby preventing the adhesive 134 from degrading.

FIGS. 24A-24D show the results of respective steps in a process for manufacturing quartz-crystal vibrating devices 100J according to this embodiment. In this method embodiment the respective steps for manufacturing the piezoelectric vibrating piece 10, the package lid 11J, and the package base 12J, and the respective steps for mounting the piezoelectric vibrating piece 10 and for bonding together the lid wafer 11W and base wafer 12W are as set forth in the protocols S11 to S15 of the method for manufacturing the first embodiment of a piezoelectric vibrating device, set forth in FIG. 3. In this ninth embodiment, the metal film 133 corresponds to the metal films 113 and 123 in the first embodiment, and the adhesive 134 corresponds to the adhesive 124 in the first embodiment. Hereinafter, an embodiment of a method for forming the notches 144 and filling them with glass 119 is described with reference to FIGS. 24A-24D.

Figure 24A:
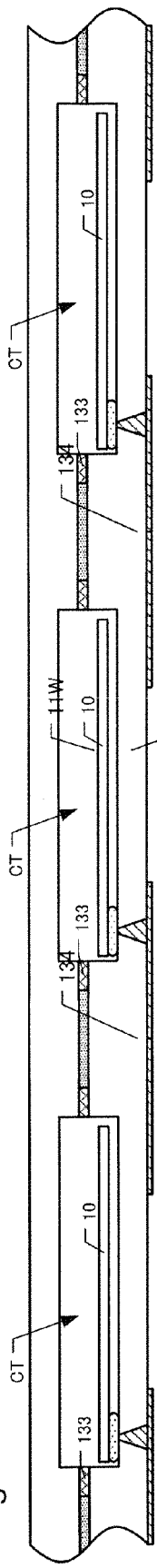
FIGS. 24A-24D depict respective steps in a method for manufacturing the ninth embodiment of a quartz-crystal vibrating device.

FIG. 24A is an elevational section of the quartz-crystal vibrating device 100J after bonding together the lid wafer 11W and the base wafer 12W. The lid wafer 11W and base wafer 12W are bonded together using an adhesive 134. The metal film 133 prevents gas, generated from heated adhesive, from entering the cavity CT.

Figure 24B:
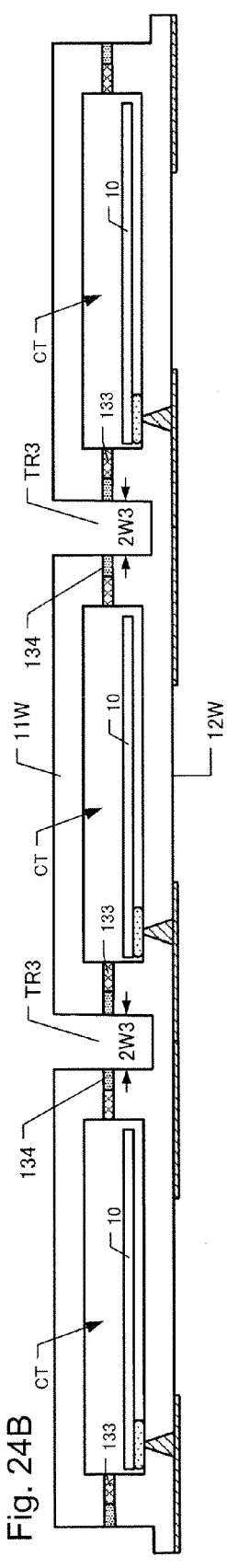

FIG. 24B is an elevational section of quartz-crystal vibrating devices 100J, in which grooves TR3 have been formed between respective cavities CT. The grooves TR3, having width (2×W3), extend around the periphery of each cavity CT and are formed by etching. The grooves TR3 are formed in a manner by which they do not cut completely through both the lid wafer 11W and the base wafer 12W.

Figure 24C:
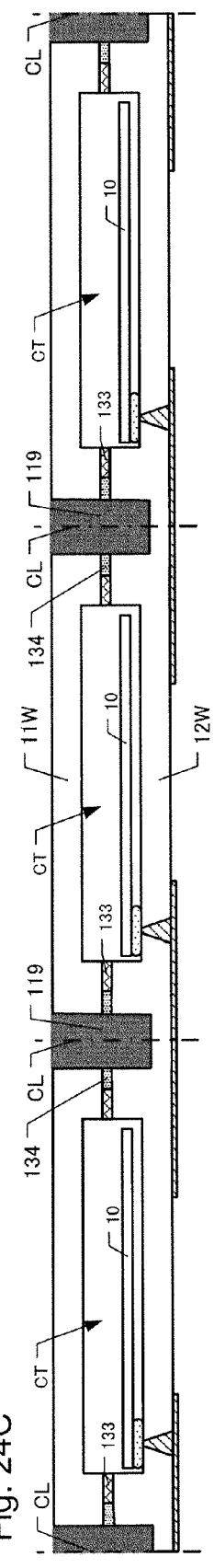
Figure 24D:
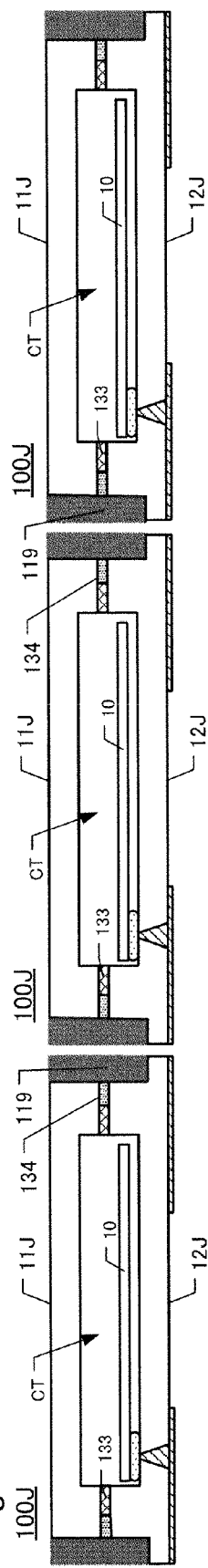

FIG. 24C is an elevational section of the vibrating devices 100J after the glass 119 has been added to the grooves TR3. The glass 119 is applied as a melt that flows into the grooves TR3. After the glass 119 has solidified, it fills the grooves TR3. FIG. 24D is an elevational section of the sandwich (of the lid wafer 11W and base wafer 12W) separated into individual quartz-crystal vibrating devices 100J. The separation is achieved by cutting the wafer sandwich along cut lines CL using a dicing unit such as a laser beam or a dicing saw. Thus, several hundreds to several thousands of quartz-crystal vibrating devices 100J are produced, each producing an accurate vibration frequency Tenth Embodiment of Quartz-Crystal Vibrating Device FIG. 25 is an elevational section of this embodiment of a quartz-crystal vibrating device 100K. In this embodiment, components that are similar to corresponding components in the first embodiment have the same respective reference numerals.

The quartz-crystal vibrating device 100K comprises a package lid 11K having a lid recess 111, a package base 12K having a base recess 121, and a quartz-crystal vibrating piece 10 mounted in the base recess 121.

The package lid 11K comprises a lid body 110J, and the package base 12K comprises a base body 120J. A band 133 of metal film 133 and a band 134 of adhesive are situated between the lid protruding portion 132 and the base protruding portion 142. The lid protruding portion 132 and base protruding portion 142 each have a width W2. The outer recess 143 has a width W3, and is situated outboard of the base protruding portion 142 on the package base 12K. Thus, a peripheral-edge recess 144 is formed. The peripheral-edge recess 144 is formed simultaneously with formation of the grooves TR3 (FIG. 26) around the periphery of each quartz-crystal vibrating device 100K. The grooves TR3 are formed so as not to cut entirely through from the package lid 11K to the package base 12K.

The vibrating device 100K also includes an exterior metal film 129 that covers the lower surface M54 of the peripheral-edge recess 144, the side surface M53 on the cavity CAV side of the recess 144, and the top surface M55 of the package lid 11K. The configuration of the exterior metal film 129 is the same as the configuration of the metal film 133.

The package lid 11K and package base 12K become bonded together when the adhesive 134 is heated to a temperature in the range of 300° C. to 400° C. in a nitrogen gas or vacuum atmosphere, while compressing them together. The presence of the outer band of metal film 129 formed outboard of the band of adhesive 134 prevents gas from entering the cavity CT during heating of the adhesive.

In this embodiment, by using a mask on the exterior metal film 129, the exterior metal film 129 can be formed only on the side surfaces M53 (on the cavity CT side) of the notch 144.

FIG. 26 are elevational sections showing the results of respective steps in an embodiment of a method for manufacturing quartz-crystal vibrating devices 100K. In this method the steps for manufacturing the piezoelectric vibrating piece 10, the package lid 11K, and the package base 12K, and the steps for mounting the piezoelectric vibrating piece 10 and bonding the lid wafer 11W and base wafer 12W together are as set forth in protocols S11-S15 for manufacturing the vibrating device of the first embodiment, shown in FIG. 3. Hereinbelow is an embodiment of a method for forming the peripheral notch 144 and exterior metal film 129.

FIG. 26A shows the vibrating device 100K after bonding together the lid wafer 11W and base wafer 12W. The lid wafer 11W and base wafer 12W are bonded together using the adhesive 134. The metal film 133 prevents gas, generated from heated adhesive, from entering the cavity CT.

FIG. 26B shows the result of forming the grooves TR3 between respective adjacent cavities CT. The grooves TR3, having width (2×W3), are formed around the periphery of each cavity CT by etching. The grooves TR3 are formed so as not to extend completely in the thickness direction from the lid wafer 11W to the base wafer 12W.

FIG. 26C shows the result of forming the exterior metal film 129. The exterior metal film 129 has a foundation layer of chromium (Cr), and an overlying layer of gold (Au). The metal film is formed on the entire upper main surface of the lid wafer 11W by sputtering or vacuum-deposition. Meanwhile, the exterior metal film 129 is also formed on the side surfaces of the grooves TR3. As previously described with respect to step S11, the exterior metal film 129 can be formed only on side surfaces of grooves TR3 using a mask.

FIG. 26D shows the result of cutting the sandwich consisting of the lid wafer 11W and the base wafer 12W into individual quartz-crystal vibrating devices 100K. Cuts are made along cut lines CL using a dicing unit such as a laser beam or a dicing saw. Thus, several hundreds to several thousands of quartz-crystal vibrating devices 100K are manufactured, each producing an accurate vibration frequency.

Multiple representative embodiments are described in detail above. As will be evident to those skilled in the relevant art, the present invention may be changed or modified in various ways within the technical scope of the invention. For example, instead of piezoelectric vibrating devices, the present invention may be directed to the manufacture of piezoelectric oscillators in which an IC accommodating an oscillating circuit is mounted inside the package on the package base. In this specification, although the various embodiments have been described in the context of AT-cut piezoelectric vibrating pieces, it will be understood that the embodiments can be applied with equal facility to tuning-fork type piezoelectric vibrating pieces having a pair of vibrating arms.

Further, in this disclosure, although the gold layers of the metal films are brought into mutual contact by compressing against each other, the respective gold layers alternatively can be bonded together (during heating of the polyimide resin to 350° C. to 400° C.) by cleaning the surfaces of the gold layers before heating and pressing them together during heating by an argon plasma process.

What is claimed is:
1. A piezoelectric device, comprising:
a piezoelectric vibrating piece that vibrates when electrically energized;
a first package plate having first and second main surfaces, the first main surface defining a main recess having a bottom surface and being surrounded by a peripheral surface that is higher than the bottom surface, the piezoelectric vibrating piece being at least partially situated in the main recess;
a second package plate aligned with the first package plate;
a continuous band of adhesive extending peripherally around the main recess, the adhesive bonding the second package plate to the peripheral surface sufficiently for the first and second plates to define a cavity enclosing the piezoelectric vibrating piece; and
a continuous band of metal film extending peripherally around the main recess inboard of the band of adhesive so as to be between the adhesive and the main recess to prevent flow of gas from the adhesive into the main recess; wherein
the band of metal film comprises a horizontal metal-film portion and a contiguous vertical metal-film portion, the horizontal metal-film portion being parallel to the peripheral surface and the vertical metal-film portion extending longitudinally from the horizontal metal-film portion;
the vertical metal-film portion is bonded to an inner wall of the main recess of the first package plate; and
the band of adhesive extends onto the peripheral surface and contacts the vertical metal-film portion on the peripheral surface and also contacts the horizontal metal-film portion.

2. The piezoelectric device of claim 1, wherein the adhesive comprises a polyimide resin.

3. The piezoelectric device of claim 1, wherein the metal film comprises:
a foundation layer bonded to at least one of the first package plate and second package plate; and
a gold layer bonded to and overlying the foundation layer.

4. The piezoelectric device of claim 3, wherein:
a respective foundation layer is bonded to the first package plate and to the second package plate; and
at least one gold layer is sandwiched between the respective foundation layers.

5. The piezoelectric device of claim 1, wherein the edge-recess surface is outboard of an inner wall of the main recess with a gap.

6. The piezoelectric device of claim 1, wherein:
the band of adhesive comprises an inboard adhesive band and an outboard adhesive band;
the inboard adhesive band comprises the horizontal metal-film portion and the contiguous vertical metal-film portion; and
the outboard adhesive band is separated from the inboard adhesive band by a gap.

7. A piezoelectric device, comprising:
a piezoelectric vibrating piece that vibrates when electrically energized;
a first package plate having first and second main surfaces, the first main surface defining a main recess having a bottom surface and being surrounded by a peripheral surface that is higher than the bottom surface, the piezoelectric vibrating piece being at least partially situated in the main recess;
a second package plate aligned with the first package plate;
a continuous band of adhesive extending peripherally around the main recess, the adhesive bonding the second package plate to the peripheral surface sufficiently for the first and second plates to define a cavity enclosing the piezoelectric vibrating piece; and
a continuous band of metal film extending peripherally around the main recess inboard of the band of adhesive so as to be between the adhesive and the main recess to prevent flow of gas from the adhesive into the main recess; wherein
the bonded-together first and second package plates have a circumferential edge;

the circumferential edge defines a peripheral edge recess extending peripherally around the piezoelectric device, the peripheral edge recess vertically extending from the second package plate to the first package plate but does not extend fully through a thickness of the first package plate; and the peripheral edge recess is filled with glass.

8. The piezoelectric device of claim 7, wherein the glass comprises a low-melting-point glass having lower melting point than either the first package plate or the second package plate.

9. A piezoelectric device, comprising:

a piezoelectric vibrating piece that vibrates when electrically energized;

a first package plate having first and second main surfaces, the first main surface defining a main recess having a bottom surface and being surrounded by a peripheral surface that is higher than the bottom surface, the piezoelectric vibrating piece being at least partially situated in the main recess;

a second package plate aligned with the first package plate;

a continuous band of adhesive extending peripherally around the main recess, the adhesive bonding the second package plate to the peripheral surface sufficiently for the first and second plates to define a cavity enclosing the piezoelectric vibrating piece; and a continuous band of metal film extending peripherally around the main recess inboard of the band of adhesive so as to be between the adhesive and the main recess to prevent flow of gas from the adhesive into the main recess; wherein the bonded-together first and second package plates have a circumferential edge;

the circumferential edge defines a peripheral edge recess extending peripherally around the piezoelectric device, the peripheral edge recess vertically extending from the second package plate to the first package plate but does not extend fully through a thickness of the first package plate; and the piezoelectric device further comprises an outer metal film extending into the peripheral edge recess.

10. The piezoelectric device of claim 9, wherein:

the outer metal film comprises a foundation layer and an overlying gold layer; and the foundation layer is bonded to the first package plate or the second package plate.

11. The piezoelectric device of claim 1, further comprising low-melting-point glass disposed between each band of metal film and band of adhesive.

12. The piezoelectric device of claim 1, wherein:

the piezoelectric vibrating piece vibrates by a thickness-shear vibration mode when electrically energized; or the piezoelectric vibrating piece includes a pair of vibrating arms that vibrate when electrically energized.

* * * * *